US009361786B2

(12) United States Patent
Cregg et al.

(10) Patent No.: US 9,361,786 B2
(45) Date of Patent: Jun. 7, 2016

(54) SYSTEMS AND METHODS TO CONTROL WINDOW COVERINGS USING POWERLINE AND RADIO FREQUENCY COMMUNICATIONS

(71) Applicant: SmartLabs, Inc., Irvine, CA (US)

(72) Inventors: Daniel Brian Cregg, Lake Elsinore, CA (US); Joseph J. Dada, Newport Beach, CA (US); Marcus Paul Escobosa, Lake Forest, CA (US)

(73) Assignee: SMARTLABS, INC., Irvine, CA (US)

( * ) Notice: Subject to any disclaimer, the term of this patent is extended or adjusted under 35 U.S.C. 154(b) by 235 days.

(21) Appl. No.: 14/097,573

(22) Filed: Dec. 5, 2013

(65) Prior Publication Data

US 2015/0161884 A1 Jun. 11, 2015

(51) Int. Cl.

*H03K 17/00* (2006.01)
*G08C 17/02* (2006.01)
*G08C 19/28* (2006.01)

(52) U.S. Cl.

CPC ................ *G08C 17/02* (2013.01); *G08C 19/28* (2013.01); *G08C 2201/91* (2013.01)

(58) Field of Classification Search

CPC ............................ G08C 19/28; G08C 2201/91
USPC ............................................... 340/12.25, 538
See application file for complete search history.

(56) References Cited

U.S. PATENT DOCUMENTS 5,148,159 A 9/1992 Clark et al.
5,288,981 A 2/1994 Davis
6,734,784 B1 5/2004 Lester
7,034,899 B2 4/2006 Symoen et al.
7,345,998 B2 3/2008 Cregg et al.
7,528,716 B2 5/2009 Jackson
8,081,649 B2 12/2011 Cregg et al.
8,223,783 B2 7/2012 Shorty et al.
8,331,544 B2 12/2012 Kraus et al.
8,358,197 B2 1/2013 Tran
8,558,697 B2 10/2013 Clough
2002/0146993 A1 10/2002 Persico et al.
2003/0098777 A1 5/2003 Taylor et al.
2003/0103521 A1 6/2003 Raphaeli et al.
2003/0142685 A1 7/2003 Bare (Continued)

FOREIGN PATENT DOCUMENTS

CN 101833802 B 1/2012
KR 2006096558 A 9/2006

(Continued)

*Primary Examiner* — Vernal Brown
(74) *Attorney, Agent, or Firm* — Knobbe, Martens, Olson & Bear, LLP

(57) ABSTRACT

An electronic window covering control system automatically controls raising, lowering, and rotating a window covering of a window. A window covering controller interfaces with an electronic window covering, sends messages including sensor data to a local receiver, and receives messages including window covering commands from the local receiver. In turn, the local receiver interfaces with a hub device through a mesh network. The hub receives the sensor data, applies a rule set to make window covering operation decisions, and sends messages, which may comprise commands to operate the window covering, through the mesh network to the local receiver. The local receiver decodes the messages and passes the window covering commands to the window covering controller to automatically control the electronic window covering.

20 Claims, 21 Drawing Sheets

(56) References Cited

U.S. PATENT DOCUMENTS

| | | | |
|---|---|---|---|
| 2004/0243684 | A1 | 12/2004 | Ha et al. |
| 2005/0104730 | A1 | 5/2005 | Yang |
| 2006/0126617 | A1 | 6/2006 | Cregg et al. |
| 2006/0164206 | A1 | 7/2006 | Buckingham et al. |
| 2006/0185799 | A1* | 8/2006 | Kates ........................ E06B 9/32 160/5 |
| 2006/0196926 | A1 | 9/2006 | Benson et al. |
| 2007/0162536 | A1 | 7/2007 | Ostrovsky et al. |
| 2007/0290793 | A1 | 12/2007 | Tran |
| 2008/0106241 | A1 | 5/2008 | Deaver et al. |
| 2008/0130673 | A1 | 6/2008 | Cregg et al. |
| 2009/0051528 | A1 | 2/2009 | Graichen |
| 2010/0005166 | A1 | 1/2010 | Chung |
| 2010/0277286 | A1 | 11/2010 | Burkart et al. |
| 2010/0283579 | A1 | 11/2010 | Kraus et al. |
| 2011/0051721 | A1 | 3/2011 | Brothwell et al. |
| 2011/0109433 | A1 | 5/2011 | Kuenzi et al. |
| 2012/0253535 | A1 | 10/2012 | Newman, Jr. et al. |
| 2012/0299314 | A1 | 11/2012 | Jiang |
| 2013/0008958 | A1 | 1/2013 | Smith et al. |
| 2013/0090744 | A1 | 4/2013 | Tran |
| 2013/0124883 | A1 | 5/2013 | Addepalli et al. |
| 2013/0176107 | A1 | 7/2013 | Dumas et al. |
| 2013/0201009 | A1 | 8/2013 | Lin et al. |
| 2013/0237193 | A1 | 9/2013 | Dumas et al. |
| 2013/0246543 | A1 | 9/2013 | Pasek |
| 2014/0001977 | A1* | 1/2014 | Zacharchuk ........ H04L 12/2816 315/291 |
| 2014/0129606 | A1 | 5/2014 | Cate et al. |
| 2014/0192912 | A1 | 7/2014 | Chappel et al. |
| 2015/0082033 | A1 | 3/2015 | Bruce et al. |
| 2015/0085845 | A1 | 3/2015 | Wang et al. |
| 2015/0092545 | A1 | 4/2015 | Katar et al. |
| 2015/0116075 | A1 | 4/2015 | Cregg et al. |
| 2015/0116080 | A1 | 4/2015 | Cregg et al. |
| 2015/0116082 | A1 | 4/2015 | Cregg et al. |
| 2015/0116097 | A1 | 4/2015 | Cregg et al. |
| 2015/0130276 | A1 | 5/2015 | Mceill-McCallum et al. |
| 2015/0160626 | A1 | 6/2015 | Cregg et al. |

FOREIGN PATENT DOCUMENTS

| | | |
|---|---|---|
| KR | 101034957 81 | 5/2011 |
| KR | 1020120105614 A | 9/2012 |
| WO | WO 2006/065275 | 6/2006 |

* cited by examiner

1700

| | |
|---|---|
| Center Frequency | 915 MHz |
| Data Encoding Method | Mancester |
| Modulation Method | FSK |
| FSK Deviation | 64 KHz |
| FSK Symbol Rate | 76,800 symbols per second |
| Data Rate | 38,400 bits per second |
| Range | 150 feet outdoors |

FIG. 17

SYSTEMS AND METHODS TO CONTROL WINDOW COVERINGS USING POWERLINE AND RADIO FREQUENCY COMMUNICATIONS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Communication among low-cost devices is useful in many applications. For example, in a home environment, room occupancy sensors, light switches, lamp dimmers, and a gateway to the Internet can all work together if they are in communication. A room in a home could be illuminated when people are present, or else an alarm could be sounded, depending on conditions established by a program running on a remote computer.

Home automation systems can use existing powerline wiring as a communication network to communicate messages between devices that receive power from the powerline. However, many devices operate remotely from the household powerline wiring, such as battery operated devices and low voltage devices, and are prevented from communicating over the powerline network.

SUMMARY

A communication system including a local controller and a local receiver is disclosed. In certain embodiments, the local controller and the local receiver are battery operated and configured to save power for longer battery life. The local controller is further configured to control an operation, such as locking/unlocking a door, raising/lowering window coverings, and the like. The local controller receives sensor data and sends messages which may be based on the sensor data to the local receiver. The local receiver is configured to transmit and receive electromagnetic signals and to synchronize with devices on a simulcast mesh communication network that utilizes powerline signaling and radio frequency signaling to propagate messages. In an embodiment, the mesh network comprises an INSTEON® network.

The local receiver periodically checks for message from the local controller. To conserve power, the local receiver may wait for an interrupt from the local controller which provides an indication that the local controller has a message to send through the network. Once synchronized with the network, the local receiver transmits the message as a modulated radio frequency signal to the network. Devices on the network can propagate the message through the network using more than one medium. For instance, the devices can encode the message onto a carrier signal added to a powerline waveform and sent at the powerline zero crossings and the devices can send the message as the modulated radio frequency signal.

To further conserve power, the local receiver may wait for activity on the powerline before checking if there is a message for it to pass on to the local controller. Once a message addressed to the local receiver is detected, the local receiver decodes the message and passes the instructions to the local controller.

In an embodiment, the local controller comprises a door lock controller having a sensor, such as a motion sensor or an RF envelope sensor, and a rule set to determine whether the door lock controller permits operation of a keypad associated with the door lock.

The door controller sends messages containing door lock data to the local receiver and receives messages containing door lock commands from the local receiver. In turn, the local receiver interfaces with a hub device through the network. The hub receives the door lock data, applies a rule set to make lock operation decisions, and sends messages, which may comprise commands to operate the door lock, through the network to the local receiver. The local receiver decodes the messages and passes the commands to the door lock controller to control the door lock.

In situations where the door is instructed to unlock, electronic circuitry or magnetic switching can be used to check whether the door unlocked. In other situations where the door is instructed to lock, the electronic circuitry or magnetic switching can be used to check whether the door locked. When the checking mechanism indicates that the message was not received or the lock operation failed, the system can alert the user to take appropriate lock action.

In another embodiment, the local controller comprises a window covering controller to control the raising and lowering of window coverings. In embodiments where the window covering comprises window blinds having slats that adjust by rotating from an open position to a closed position, the window covering controller can further control the angle of the slates in the blinds. The window covering controller receives data, such as command data from a remote or sensor data from sensors associated with a window. The window covering controller sends messages including window covering data to the local receiver and receives messages containing window covering commands from the local receiver. In turn, the local receiver interfaces with the hub device through the network. The hub receives the window covering data, applies a rule set to make window covering decisions, and sends messages, which may comprise commands to operate the window coverings, through the network to the local receiver. The local receiver decodes the messages and passes the commands to the window covering controller to control the window covering.

Embodiments of the window covering rule sets determine the window covering operation to be performed and prioritization of the rule sets when there are multiple rule sets. For example, the window covering controller receives information pertaining to temperature or light intensity from sensors associated with the window covering and sends messages to the hub. The hub sends commands to control the window covering to reduce the sunlight entering the room. The hub can also dim or switch electric lighting in response to changing daylight availability.

According to a number of embodiments, the disclosure relates to a battery-powered window covering control system operating remotely from a powerline and configured to interface with a mesh network. The system comprises a window covering controller configured to receive a window covering command. The window covering controller is operably connected to a window covering associated with a window to automatically adjust the window covering to at least partially cover and uncover the window between a first position and a second position based at least in part on the window covering command, and is electrically disconnected from a powerline. The system further comprises a local receiver configured to wirelessly detect a presence of a first radio frequency (RF) signal having a first frequency. The presence of the first RF signal is indicative of a first message encoded onto the powerline, and the local receiver is electrically disconnected from the powerline. The local receiver is further configured to wake up from an inactive state upon receipt of the presence of the first RF signal on the powerline to receive a second message via a second RF signal having a second RF frequency different from the first RF frequency and to determine whether a device address of the second message is an assigned address. The local receiver returns to an inactive state when the device address of the second message is not the assigned address. The second message comprises the window covering command when the device address is the assigned address and the local receiver sends the window covering command to the window covering controller.

In an embodiment, the system further comprises a mesh network configured to transmit and receive messages using one or more of powerline signaling and radio frequency (RF) signaling. The powerline signaling comprises message data modulated onto a carrier signal and the modulated carrier signal added to a powerline waveform, and the RF signaling comprises the message data modulated onto an RF signal. The system further comprises a hub device in communication with the mesh network and configured to receive sensor data and to generate the window covering command based at least in part on the sensor data, where the sensor data comprises at least one of temperature data and light intensity data of a space associated with the window and the hub device is further configured to receive identifiers associated with one or more occupants based at least in part on the identifiers, to retrieve preferences of the one or more occupants, and to generate the window covering command based at least in part on at least one of the temperature data, the light intensity data, and the preferences.

In an embodiment, the system further comprises at least one sensor, where the window covering controller is further configured to receive sensor data from the at least one sensor. The local receiver is further configured to receive the sensor data from the window covering controller, to modulate the sensor data onto the RF signal, and to transmit the modulated RF signal comprising the sensor data over the mesh network. The system further comprises a hub device in communication with the mesh network and configured to receive the modulated RF signal comprising the sensor data from the mesh network, to recover the sensor data, and to generate the window covering command based at least in part of the sensor data. The system further comprises a power supply comprising a battery configured to supply power, where the power supply is electrically connected to the window covering controller and the local receiver.

Certain embodiments relate to a method to control an electronic window covering. The method comprises wirelessly detecting a presence of a first radio frequency (RF) signal having a first frequency, where the presence of the first RF signal is indicative of a first message encoded onto a powerline, waking up a local receiver from an inactive state based on the presence of the first RF signal on the powerline and receiving a second message via a second RF signal having a second RF frequency different from the first RF frequency, where the local receiver is electrically disconnected from the powerline, and determining whether a device address of the second message is an assigned address, where the second message comprises a window covering command when the device address is the assigned address. The method further comprises returning the local receiver to an inactive state when the device address of the second message is not the assigned address, sending to a window covering controller the window covering command when the device address of the second message is the assigned address, and automatically moving a window covering configured to at least partially cover and uncover a window between a first position and a second position based at least in part on the window covering command, where the window covering controller is electrically disconnected from the powerline.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 17 is a table of exemplary specifications for RF signaling within the communication network, according to certain embodiments.

DETAILED DESCRIPTION OF THE PREFERRED EMBODIMENT

The features of the systems and methods will now be described with reference to the drawings summarized above. Throughout the drawings, reference numbers are re-used to indicate correspondence between referenced elements. The drawings, associated descriptions, and specific implementation are provided to illustrate embodiments of the inventions and not to limit the scope of the disclosure.

Figure 1:
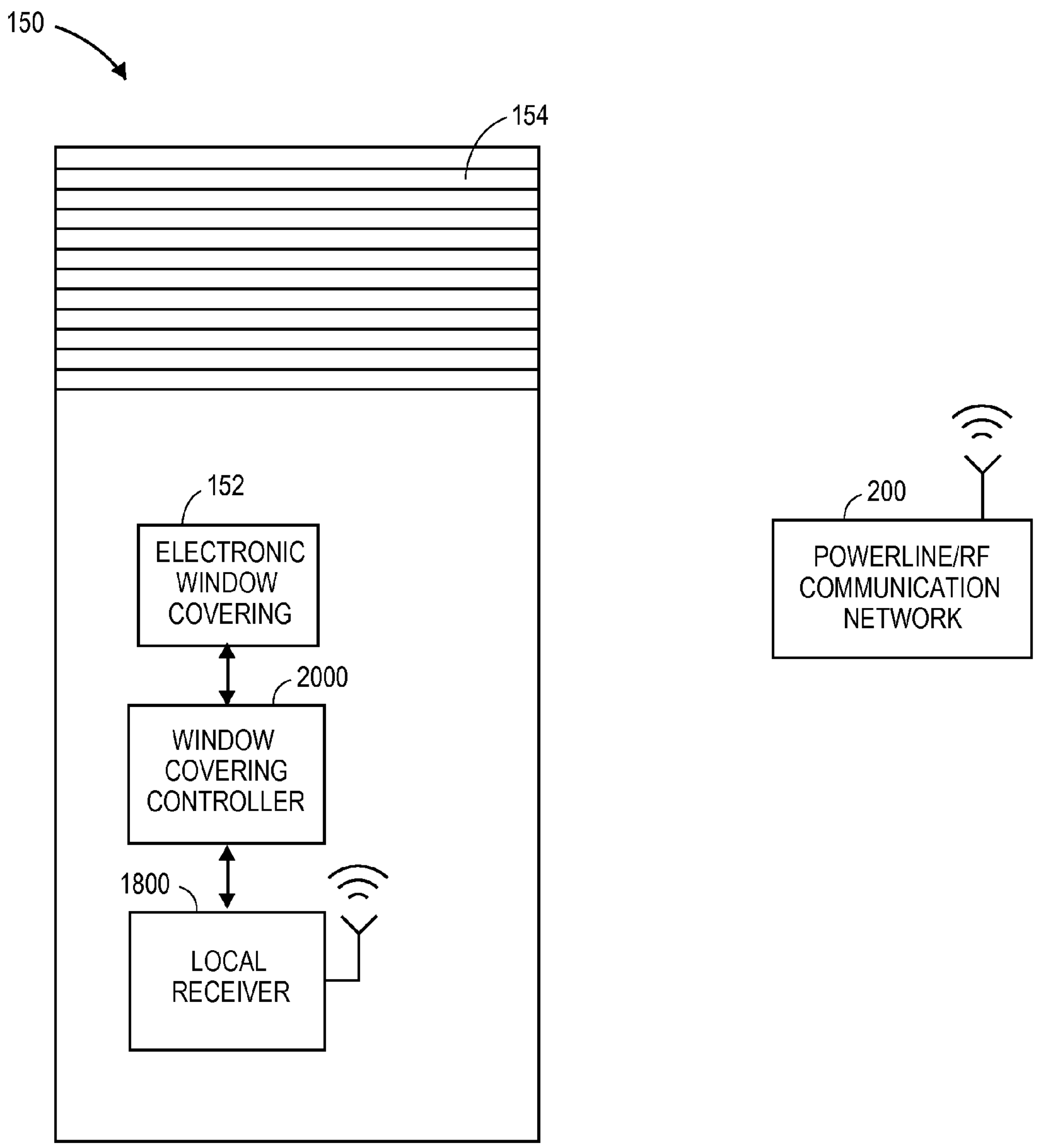
FIG. 1 is a block diagram illustrating a window covering control system, according to certain embodiments.

FIG. 1 is a block diagram illustrating an embodiment of a window covering control system 150 comprising an electronic window covering 152, a local controller 2000, a local receiver 1800, and a communication network 200. In an embodiment, the local controller 2000 comprises a window covering controller that is configured to control the electronic window covering 152 and to communicate through the local receiver 1800 to the communication network 200. In an embodiment, the window covering controller 2000 comprises the electronic window covering 152. In another embodiment, the window covering controller 2000 comprises the local receiver 1800. In a further embodiment, the network 200 comprises the local receiver 1800.

The electronic window covering 152 is associated with a window and is configured to at least partially cover and uncover the window to manage sunlight, harvest light, control temperature, weatherproof, ensure privacy, provide security, protect against theft, protect against bad weather, provide fire protection, provide decoration, or the like. The electronic window covering 152 is configured to move from a position that covers the window to a position that uncovers the window through a plurality of positions between the covered and the uncovered position. The window covering 152 may be on the interior side or the exterior side of the window. Types of electronic window coverings 152 include, but are not limited to curtains, drapes, window blinds which include slats, such as for example, venetian blinds, mini blinds, vertical blinds, horizontal blinds, and the like, shutters which include louvers, window shades, such as for example, roman shades, folding shades, roller shades, honeycomb shades, and the like, solar screens, and the like. The electronic window coverings 152 are typically machine-operated, but in certain embodiments, may also be hand-operated.

The window covering controller 2000 is configured to control raising and lowering of the electronic window covering 152. In an embodiment, the electronic window covering 152 comprises a window blind including a plurality of slats 154 that adjust by rotating from an open position to a closed position through a plurality of positions between the open and the closed position. The window covering controller 2000 is further configured to control rotating or tilting the slats 154 of the electronic window blind 152.

The window covering controller 2000 receives data from one or more of the electronic window coverings 152, a user or occupant, one or more sensors, and the network 200. In an embodiment, the window covering controller 2000 determines whether to raise, lower, and rotate the slats 154 of the electronic window covering 152 based at least in part on the data. In other embodiments, the window covering controller 2000 sends the data from the electronic window covering 152 to the local receiver 1800, which passes the data to the network 200, and receives commands and/or data from network 200 through the local receiver 1800. In certain embodiments, the window covering controller 2000 and the local receiver 1800 are located in or near the electronic window covering 152.

The local receiver 1800 is configured to format data from the window covering controller 2000 into one or more messages and transmit the one or more messages to the network 200 using radio frequency (RF) signaling. The local receiver 1800 is further configured to receive RF messages from the network 200, decode the messages, and pass the data and/or commands from the network 200 to the window covering controller 2000.

Network

The network 200 is configured to receive messages from the local receiver 1800 and pass the messages to a network hub within the network which decodes the messages. The network 200 is further configured to receive data and/or commands from the network hub and propagate the messages to the local receiver 1800.

In an embodiment, the network 200 comprises a dual-band mesh area networking topology to communicate with devices located within the network 200. In an embodiment, the network 200 comprises an INSTEON® network utilizing an INSTEON® engine employing a powerline protocol and an RF protocol. The devices can comprise, for example, light switches, thermostats, motion sensors, and the like. INSTEON® devices are peers, meaning each device can transmit, receive, and repeat any message of the INSTEON® protocol, without requiring a master controller or routing software.

Figure 2:
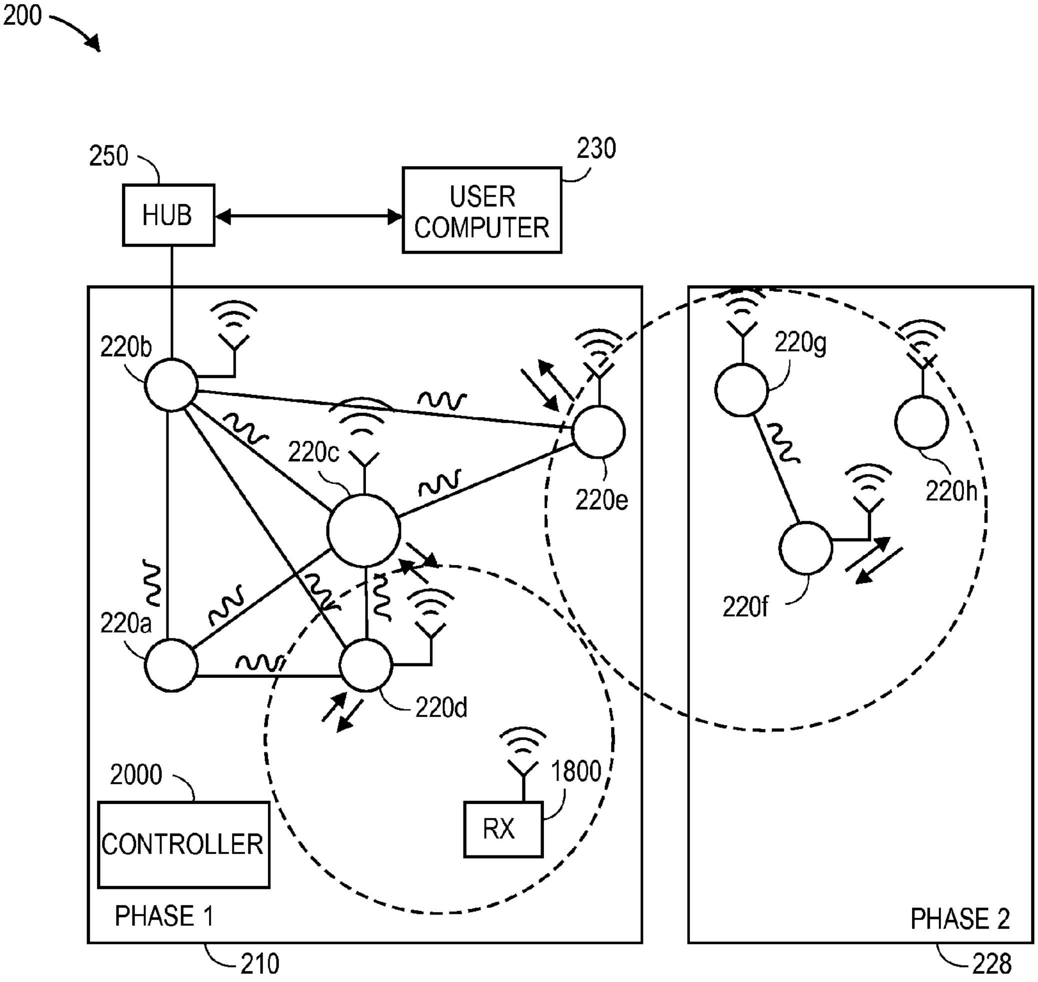
FIG. 2 is a block diagram of a powerline and radio frequency communication network, according to certain embodiments.

FIG. 2 illustrates the communication network 200 of control and communication devices 220 communicating over the network 200 using one or more of powerline signaling and RF signaling. The network 200 further comprises the local receiver 1800 communicating over the network 200 using the RF signaling. In an embodiment, the communication network 200 comprises a mesh network. In another embodiment, the communication network 200 comprises a simulcast mesh network. In a further embodiment, the communication network 200 comprises an INSTEON® network.

Electrical power is most commonly distributed to buildings and homes in North America as single split-phase alternating current. At the main junction box to the building, the three-wire single-phase distribution system is split into two two-wire 110 VAC powerlines, known as Phase 1 and Phase 2. Phase 1 wiring is typically used for half the circuits in the building and Phase 2 is used for the other half. In the exemplary network 200, devices 220*a*-220*e* are connected to a Phase 1 powerline 210 and devices 220*f*-220*h* are connected to a Phase 2 powerline 228.

In the network 200, device 220*a* is configured to communicate over the powerline; device 220*h* is configured to communicate via RF; and devices 220*b*-220*g* are configured to communicate over the powerline and via RF. Additionally device 220*b* can be configured to communicate to a hub 250 and the hub 250 can be configured to communicate with a computer 230 and other digital equipment using, for example, RS232, USB, IEEE 802.3, or Ethernet protocols and communication hardware. Hub 250 on the network 200 communicating with the computer 230 and other digital devices can, for example, bridge to networks of otherwise incompatible devices in a building, connect to computers, act as nodes on a local-area network (LAN), or get onto the global Internet. In an embodiment, the computer 230 comprises a personal computer, a laptop, a tablet, a smartphone, or the like, and interfaces with a user.

Further, hub 250 can be configured to receive messages containing data from the local controller 2000 via the local receiver 1800 and the network 200. The hub 250 can further be configured to provide information to a user through the computer 230, and can be configured to provide data and/or commands to the local controller 2000 via the local receiver 1800 and the network 200.

In an embodiment, devices 220*a*-220*g* that send and receive messages over the powerline use the INSTEON® Powerline protocol, and devices 220*b*-220*h* that send and receive radio frequency (RF) messages use the INSTEON® RF protocol, as defined in U.S. Pat. Nos. 7,345,998 and 8,081,649 which are hereby incorporated by reference herein in their entireties. INSTEON® is a trademark of the applicant.

Devices 220*b*-220*h* that use multiple media or layers solve a significant problem experienced by devices that only communicate via the powerline, such as device 220*a*, or by devices that only communicate via RF, such as device 220*h*. Powerline signals on opposite powerline phases 210 and 228 are severely attenuated because there is no direct circuit connection for them to travel over. RF barriers can prevent direct RF communication between devices RF only devices. Using devices capable of communicating over two or more of the communication layers solves the powerline phase coupling problem whenever such devices are connected on opposite powerline phases and solves problems with RF barriers between RF devices. Thus, within the network 200, the powerline layer assists the RF layer, and the RF layer assists the powerline layer.

As shown in FIG. 2, device 220*a* is installed on powerline Phase 1 210 and device 220*f* is installed on powerline Phase 2 228. Device 220*a* can communicate via powerline with devices 220*b*-220*e* on powerline Phase 1 210, but it can also communicate via powerline with device 220*f* on powerline Phase 2 228 because it can communicate over the powerline to device 220*e*, which can communicate to device 220*f* using RF signaling, which in turn is directly connected to powerline Phase 2 228. The dashed circle around device 220*f* represents the RF range of device 220*f*. Direct RF paths between devices 220*e* to 220*f* (1 hop), for example, or indirect paths between devices 220*c* to 220*e* and between devices 220*e* to 220*f*, for example (2 hops) allow messages to propagate between the powerline phases.

Each device 220*a*-220*h* is configured to repeat messages to others of the devices 220*a*-220*h* on the network 200. In an embodiment, each device 220*a*-220*h* is capable of repeating messages, using the protocols as described herein. Further, the devices 220*a*-220*h* and 1800 are peers, meaning that any device can act as a master (sending messages), slave (receiving messages), or repeater (relaying messages). Adding more devices configured to communicate over more than one physical layer increases the number of available pathways for messages to travel. Path diversity results in a higher probability that a message will arrive at its intended destination.

For example, RF device 220*d* desires to send a message to device 220*e*, but device 220*e* is out of range. The message will still get through, however, because devices within range of device 220*d*, such as devices 220*a*-220*c* will receive the message and repeat it to other devices within their respective ranges. There are many ways for a message to travel: device 220*d* to 220*c* to 220*e* (2 hops), device 220*d* to 220*a* to 220*c* to 220*e* (3 hops), device 220*d* to 220*b* to 220*a* to 220*c* to 220*e* (4 hops) are some examples.

Figure 3:
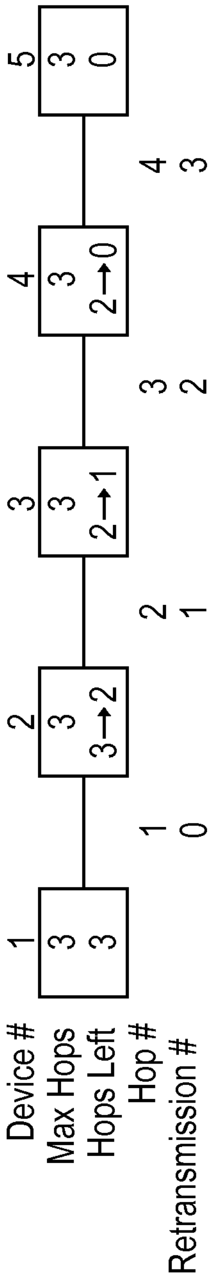
FIG. 3 is a block diagram illustrating message retransmission within the communication network, according to certain embodiments.

FIG. 3 is a block diagram illustrating message retransmission within the communication network 200. In order to improve network reliability, the devices 220 retransmit messages intended for other devices on the network 200. This increases the range that the message can travel to reach its intended device recipient.

Unless there is a limit on the number of hops that a message may take to reach its final destination, messages might propagate forever within the network 200 in a nested series of recurring loops. Network saturation by repeating messages is known as a "data storm." The message protocol avoids this problem by limiting the maximum number of hops an individual message may take to some small number. In an embodiment, messages can be retransmitted a maximum of three times. In other embodiments, the number of times a message can be retransmitted is less than 3. In further embodiments, the number of times a message can be retransmitted is greater than 3. The larger the number of retransmissions, however, the longer the message will take to complete.

Embodiments comprise a pattern of transmissions, retransmissions, and acknowledgements that occurs when messages are sent. Message fields, such as Max Hops and Hops Left manage message retransmission. In an embodiment, messages originate with the 2-bit Max Hops field set to a value of 0, 1, 2, or 3, and the 2-bit Hops Left field set to the same value. A Max Hops value of zero tells other devices 220 within range not to retransmit the message. A higher Max Hops value tells devices 220 receiving the message to retransmit it depending on the Hops Left field. If the Hops Left value is one or more, the receiving device 220 decrements the Hops Left value by one and retransmits the message with the new Hops Left value. Devices 220 that receive a message with a Hops Left value of zero will not retransmit that message. Also, the device 220 that is the intended recipient of a message will not retransmit the message, regardless of the Hops Left value.

In other words, Max Hops is the maximum retransmissions allowed. All messages "hop" at least once, so the value in the Max Hops field is one less than the number of times a message actually hops from one device to another. In embodiments where the maximum value in this field is three, there can be four actual hops, comprising the original transmission and three retransmissions. Four hops can span a chain of five devices. This situation is shown schematically in FIG. 3.

Figure 4:
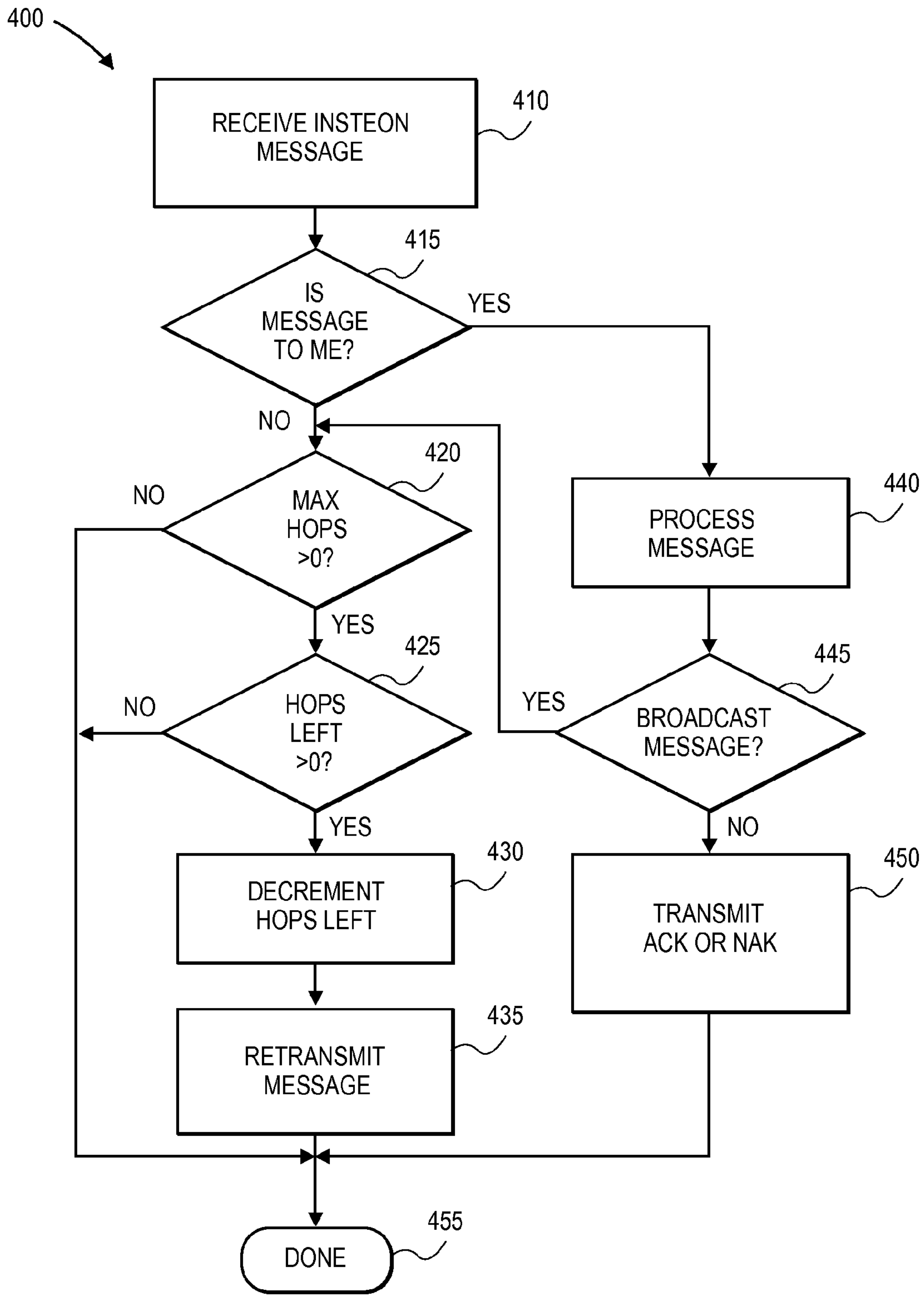
FIG. 4 illustrates a process to receive messages within the communication network, according to certain embodiments.

FIG. 4 illustrates a process 400 to receive messages within the communication network 200. The flowchart in FIG. 4 shows how the device 220 receives messages and determines whether to retransmit them or process them. At step 410, the device 220 receives a message via powerline or RF.

At step 415, the process 400 determines whether the device 220 needs to process the received message. The device 220 processes Direct messages when the device 220 is the addressee, processes Group Broadcast messages when the device 220 is a member of the group, and processes all Broadcast messages.

If the received message is a Direct message intended for the device 220, a Group Broadcast message where the device 220 is a group member, or a Broadcast message, the process 400 moves to step 440. At step 440, the device 220 processes the received message.

At step 445, the process 400 determines whether the received message is a Group Broadcast message or one of a Direct message and Direct group-cleanup message. If the message is a Direct or Direct Group-cleanup message, the process moves to step 450. At step 450, the device sends an acknowledge (ACK) or a negative acknowledge (NAK) message back to the message originator in step 450 and ends the task at step 455.

In an embodiment, the process 400 simultaneously sends the ACK/NAK message over the powerline and via RF. In another embodiment, the process 400 intelligently selects which physical layer (powerline, RF) to use for ACK/NAK message transmission. In a further embodiment, the process 400 sequentially sends the ACK/NAK message using a different physical layer for each subsequent retransmission.

If at step 445, the process 400 determines that the message is a Broadcast or Group Broadcast message, the process 400 moves to step 420. If, at step 415, the process 400 determines that the device 220 does not need to process the received message, the process 400 also moves to step 420. At step 420, the process 400 determines whether the message should be retransmitted.

At step 420, the Max Hops bit field of the Message Flags byte is tested. If the Max Hops value is zero, process 400 moves to step 455, where it is done. If the Max Hops filed is not zero, the process moves to step 425, where the Hops Left filed is tested.

If there are zero Hops Left, the process 400 moves to step 455, where it is finished. If the Hops Left field is not zero, the process 400 moves to step 430, where the process 400 decrements the Hops Left value by one.

At step 435, the process 400 retransmits the message. In an embodiment, the process 400 simultaneously retransmits the message over the powerline and via RF. In another embodiment, the process 400 intelligently selects which physical layer (PL, RF) to use for message retransmission. In a further embodiment, the process 400 sequentially retransmits the message using a different physical layer for each subsequent retransmission.

Figure 5:
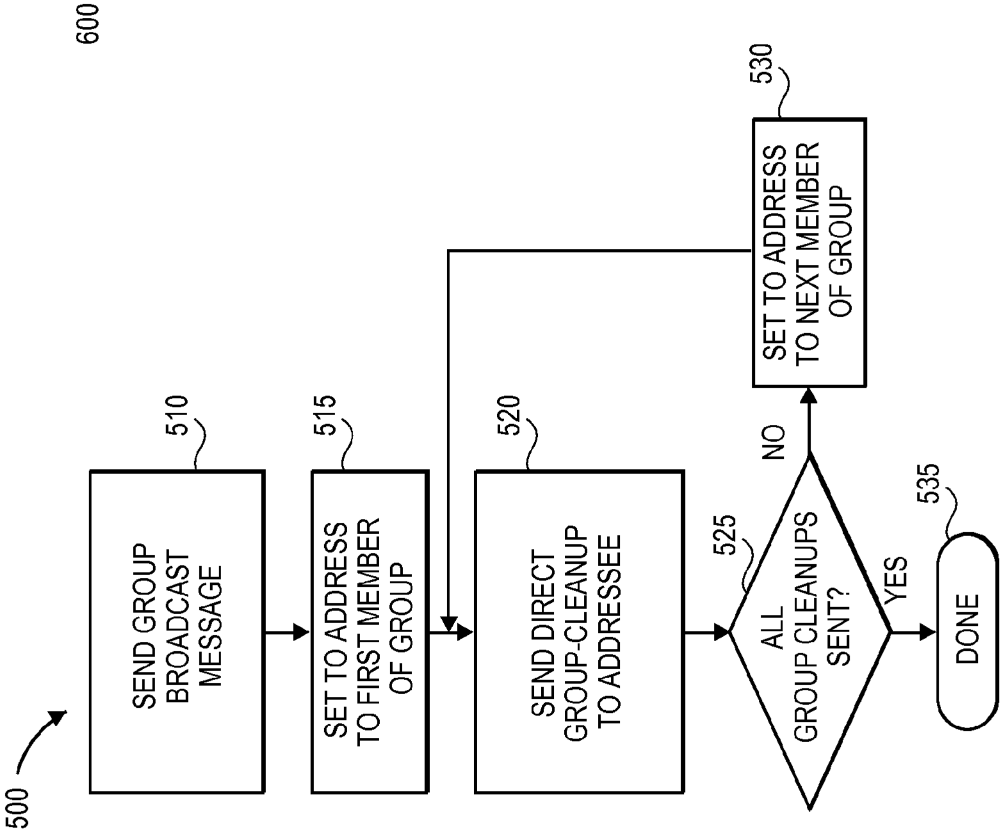
FIG. 5 illustrates a process to transmit messages to groups of devices within the communication network, according to certain embodiments.

FIG. 5 illustrates a process 500 to transmit messages to multiple recipient devices 220 in a group within the communication network 200. Group membership is stored in a database in the device 220 following a previous enrollment process. At step 510, the device 220 first sends a Group Broadcast message intended for all members of a given group. The Message Type field in the Message Flags byte is set to signify a Group Broadcast message, and the To Address field is set to the group number, which can range from 0 to 255. The device 220 transmits the message using at least one of powerline and radio frequency signaling. In an embodiment, the device 220 transmits the message using both powerline and radio frequency signaling.

Following the Group Broadcast message, the transmitting device 220 sends a Direct Group-cleanup message individually to each member of the group in its database. At step 515 the device 220 first sets the message To Address to that of the first member of the group, then it sends a Direct Group-cleanup message to that addressee at step 520. If Group-cleanup messages have been sent to every member of the group, as determined at step 525, transmission is finished at step 535. Otherwise, the device 220 sets the message To Address to that of the next member of the group and sends the next Group-cleanup message to that addressee at step 520.

Figure 6:
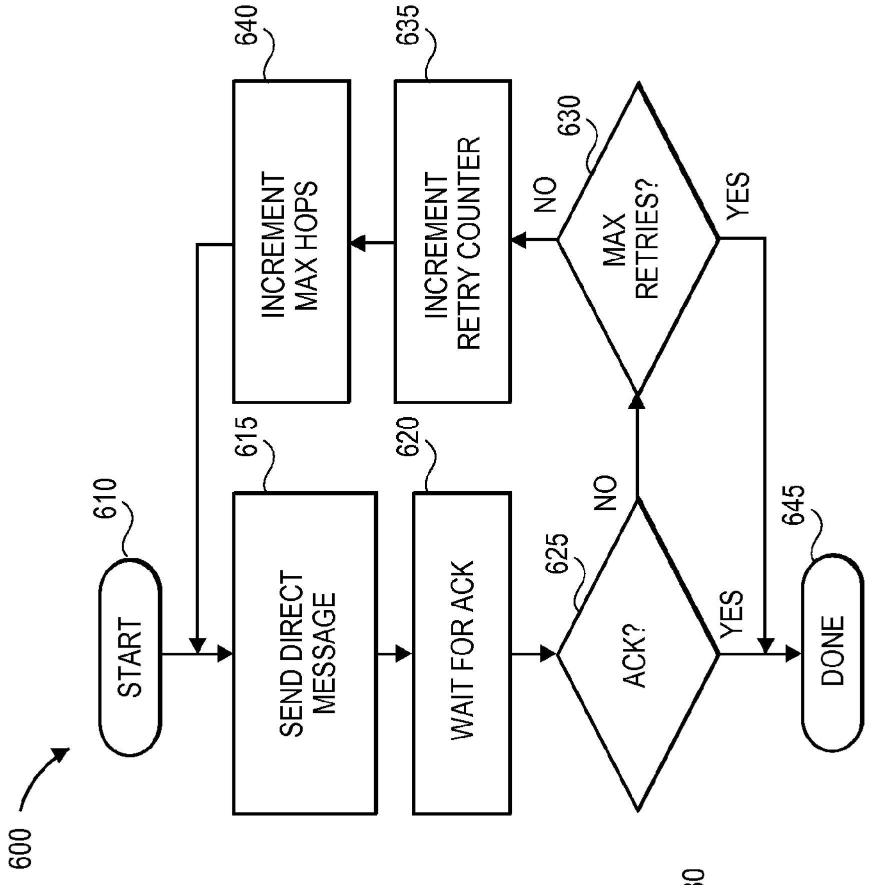
FIG. 6 illustrates a process to transmit direct messages with retries to devices within the communication network, according to certain embodiments.

FIG. 6 illustrates a process 600 to transmit direct messages with retries to the device 220 within the communication network 200. Direct messages can be retried multiple times if an expected ACK is not received from the addressee. The process begins at step 610.

At step 615, the device 220 sends a Direct or a Direct Group-cleanup message to an addressee. At step 620 the device 220 waits for an Acknowledge message from the addressee. If, at step 625, an Acknowledge message is received and it contains an ACK with the expected status, the process 600 is finished at step 645.

If, at step 625, an Acknowledge message is not received, or if it is not satisfactory, a Retry Counter is tested at step 630. If the maximum number of retries has already been attempted, the process 600 fails at step 645. In an embodiment, devices 220 default to a maximum number of retries of five. If fewer than five retries have been tried at step 630, the device 220 increments its Retry Counter at step 635. At step 640, the device 220 will also increment the Max Hops field in the Message Flags byte, up to a maximum of three, in an attempt to achieve greater range for the message by retransmitting it more times by more devices 220. The message is sent again at step 615.

Figure 7:
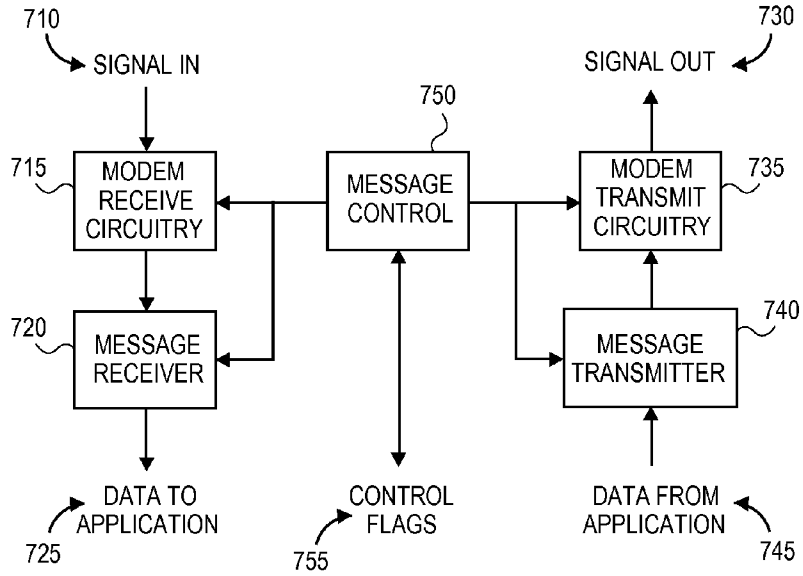
FIG. 7 is a block diagram illustrating the overall flow of information related to sending and receiving messages over the communication network, according to certain embodiments.

The devices 220 comprise hardware and firmware that enable the devices 220 to send and receive messages. FIG. 7 is a block diagram of the device 220 illustrating the overall flow of information related to sending and receiving messages. Received signals 710 come from the powerline, via radio frequency, or both. Signal conditioning circuitry 715 processes the raw signal and converts it into a digital bitstream. Message receiver firmware 720 processes the bitstream as required and places the message payload data into a buffer 725 which is available to the application running on the device 220. A message controller 750 tells the application that data is available using control flags 755.

To send a message, the application places message data in a buffer 745, then tells the message controller 750 to send the message using the control flags 755. Message transmitter 740 processes the message into a raw bitstream, which it feeds to a modem transmitter 735. The modem transmitter 735 sends the bitstream as a powerline signal, a radio frequency signal, or both.

Figure 8:
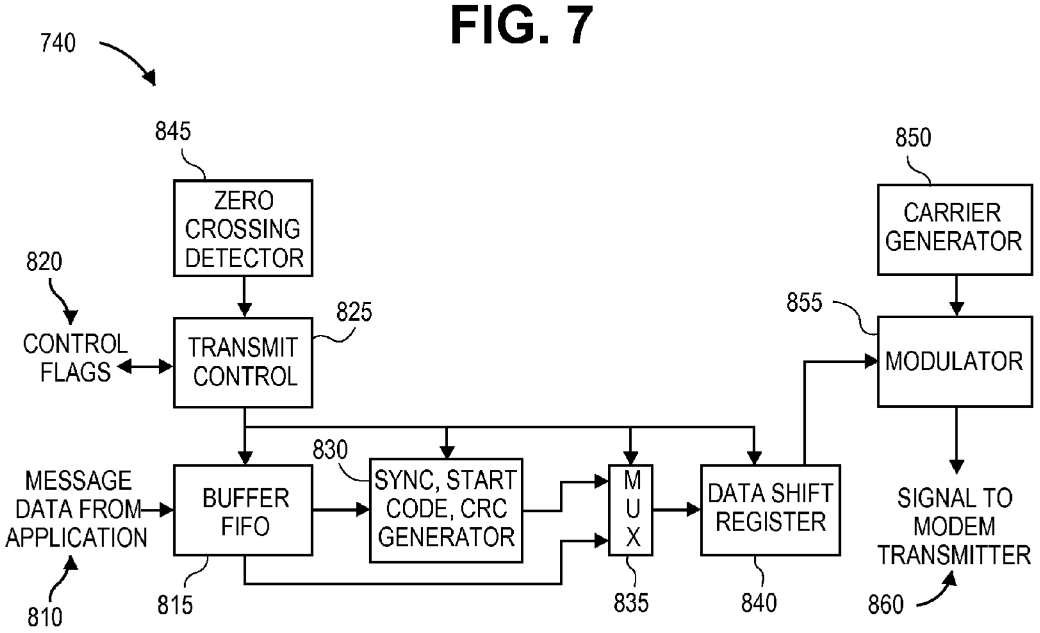
FIG. 8 is a block diagram illustrating the overall flow of information related to transmitting messages on the powerline, according to certain embodiments.

FIG. 8 shows the message transmitter 740 of FIG. 7 in greater detail and illustrates the device 220 sending a message on the powerline. The application first composes a message 810 to be sent, excluding the cyclic redundancy check (CRC) byte, and puts the message data in a transmit buffer 815. The application then tells a transmit controller 825 to send the message by setting appropriate control flags 820. The transmit controller 825 packetizes the message data using multiplexer 835 to put sync bits and a start code from a generator 830 at the beginning of a packet followed by data shifted out of the first-in first-out (FIFO) transmit buffer 815.

As the message data is shifted out of FIFO transmit buffer 815, the CRC generator 830 calculates the CRC byte, which is appended to the bitstream by the multiplexer 835 as the last byte in the last packet of the message. The bitstream is buffered in a shift register 840 and clocked out in phase with the powerline zero crossings detected by zero crossing detector 845. The phase shift keying (PSK) modulator 855 shifts the phase of an approximately 131.65 kHz carrier signal from carrier generator 850 by 180 degrees for zero-bits, and leaves the carrier signal unmodulated for one-bits. In other embodiments, the carrier signal can be greater than or less than approximately 131.65 kHz. Note that the phase is shifted gradually over one carrier period as disclosed in conjunction with FIG. 11. Finally, the modulated carrier signal is applied to the powerline by the modem transmit circuitry 735 of FIG. 7.

Figure 9:
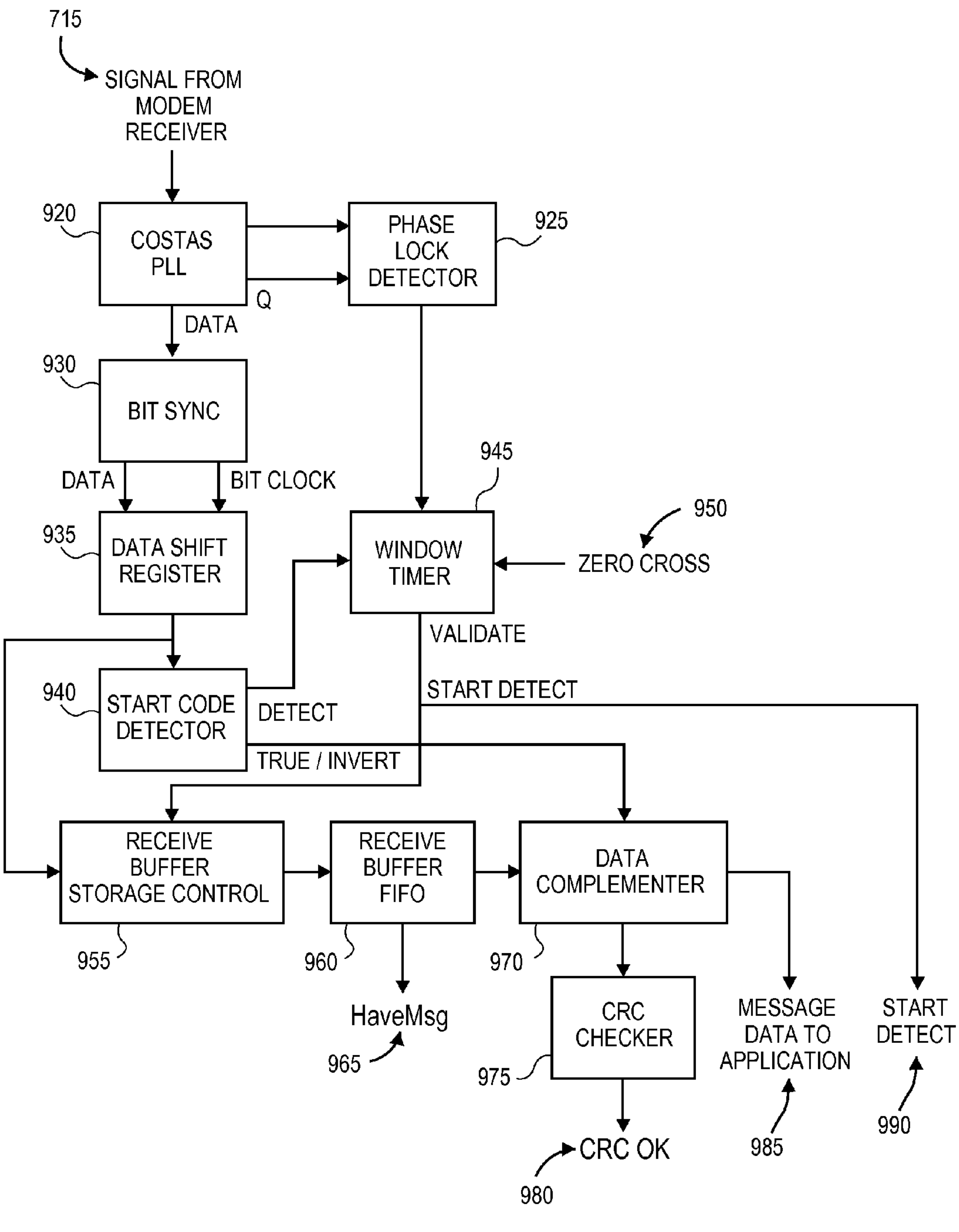
FIG. 9 is a block diagram illustrating the overall flow of information related to receiving messages from the powerline, according to certain embodiments.

FIG. 9 shows message receiver 720 of FIG. 7 in greater detail and illustrates the device 220 receiving a message from the powerline. The modem receive circuitry 715 of FIG. 7 conditions the signal on the powerline and transforms it into a digital data stream that the firmware in FIG. 9 processes to retrieve messages. Raw data from the powerline is typically very noisy, because the received signal amplitude can be as low as only few millivolts, and the powerline often carries high-energy noise spikes or other noise of its own. Therefore, in an embodiment, a Costas phase-locked-loop (PLL) 920, implemented in firmware, is used to find the PSK signal within the noise. Costas PLLs, well known in the art, phase-lock to a signal both in phase and in quadrature. A phase-lock detector 925 provides one input to a window timer 945, which also receives a zero crossing signal 950 and an indication that a start code in a packet has been found by start code detector 940.

Whether it is phase-locked or not, the Costas PLL 920 sends data to the bit sync detector 930. When the sync bits of alternating ones and zeros at the beginning of a packet arrive, the bit sync detector 930 will be able to recover a bit clock, which it uses to shift data into data shift register 935. The start code detector 940 looks for the start code following the sync bits and outputs a detect signal to the window timer 945 after it has found one. The window timer 945 determines that a valid packet is being received when the data stream begins approximately 800 microseconds before the powerline zero crossing, the phase lock detector 925 indicates lock, and detector 940 has found a valid start code. At that point the window timer 945 sets a start detect flag 990 and enables the receive buffer controller 955 to begin accumulating packet data from shift register 935 into the FIFO receive buffer 960. The storage controller 955 insures that the FIFO 960 builds up the data bytes in a message, and not sync bits or start codes. It stores the correct number of bytes, 10 for a standard message and 24 for an extended message, for example, by inspecting the Extended Message bit in the Message Flags byte. When the correct number of bytes has been accumulated, a HaveMsg flag 965 is set to indicate a message has been received.

Costas PLLs have a phase ambiguity of 180 degrees, since they can lock to a signal equally well in phase or anti-phase. Therefore, the detected data from PLL 920 may be inverted from its true sense. The start code detector 940 resolves the ambiguity by looking for the true start code, C3 hexadecimal, and also its complement, 3C hexadecimal. If it finds the complement, the PLL is locked in antiphase and the data bits are inverted. A signal from the start code detector 940 tells the data complementer 970 whether to un-invert the data or not. The CRC checker 975 computes a CRC on the received data and compares it to the CRC in the received message. If they match, the CRC OK flag 980 is set.

Data from the complementer 970 flows into an application buffer, not shown, via path 985. The application will have received a valid message when the HaveMsg flag 965 and the CRC OK flag 980 are both set.

Figure 10:
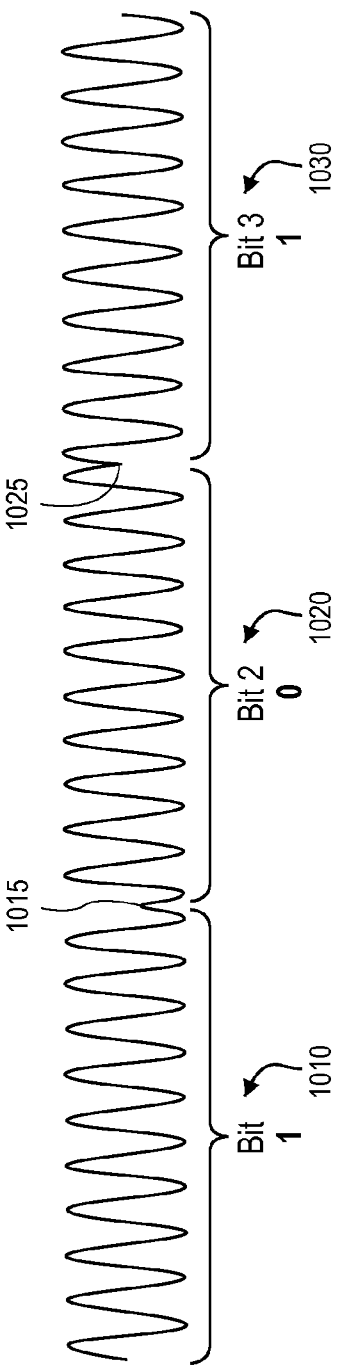
FIG. 10 illustrates a powerline signal, according to certain embodiments.

FIG. 10 illustrates an exemplary 131.65 kHz powerline carrier signal with alternating BPSK bit modulation. Each bit uses ten cycles of carrier. Bit 1010, interpreted as a one, begins with a positive-going carrier cycle. Bit 2 1020, interpreted as a zero, begins with a negative-going carrier cycle. Bit 3 1030, begins with a positive-going carrier cycle, so it is interpreted as a one. Note that the sense of the bit interpretations is arbitrary. That is, ones and zeros could be reversed as long as the interpretation is consistent. Phase transitions only occur when a bitstream changes from a zero to a one or from a one to a zero. A one followed by another one, or a zero followed by another zero, will not cause a phase transition. This type of coding is known as NRZ or nonreturn to zero.

FIG. 10 shows abrupt phase transitions of 180 degrees at the bit boundaries 1015 and 1025. Abrupt phase transitions introduce troublesome high-frequency components into the signal's spectrum. Phase-locked detectors can have trouble tracking such a signal. To solve this problem, the powerline encoding process uses a gradual phase change to reduce the unwanted frequency components.

Figure 11:
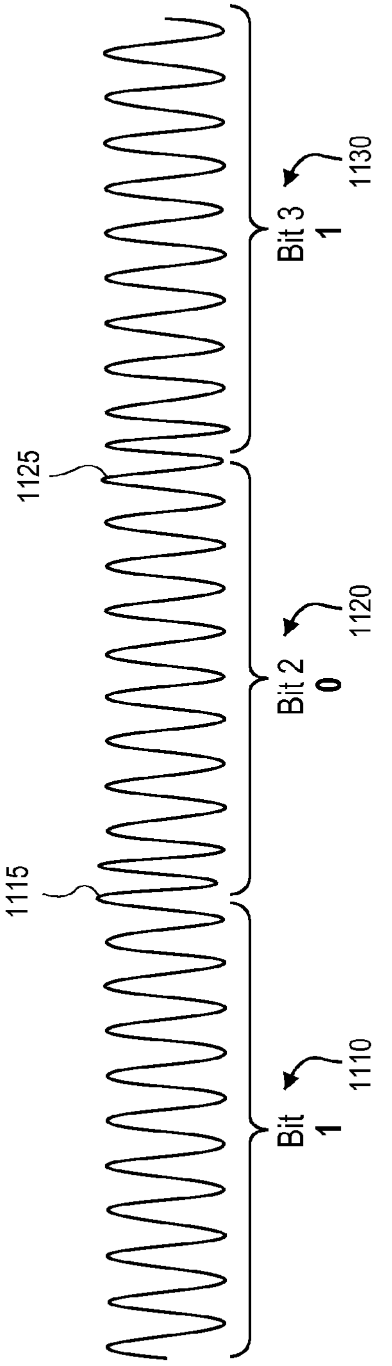
FIG. 11 illustrates a powerline signal with transition smoothing, according to certain embodiments.

FIG. 11 illustrates the powerline BPSK signal of FIG. 10 with gradual phase shifting of the transitions. The transmitter introduces the phase change by inserting approximately 1.5 cycles of carrier at 1.5 times the approximately 131.65 kHz frequency. Thus, in the time taken by one cycle of 131.65 kHz, three half-cycles of carrier will have occurred, so the phase of the carrier is reversed at the end of the period due to the odd number of half-cycles. Note the smooth transitions 1115 and 1125.

In an embodiment, the powerline packets comprise 24 bits. Since a bit takes ten cycles of 131.65 kHz carrier, there are 240 cycles of carrier in a packet, meaning that a packet lasts approximately 1.823 milliseconds. The powerline environment is notorious for uncontrolled noise, especially high-amplitude spikes caused by motors, dimmers and compact fluorescent lighting. This noise is minimal during the time that the current on the powerline reverses direction, a time known as the powerline zero crossing. Therefore, the packets are transmitted near the zero crossing.

Figure 12:
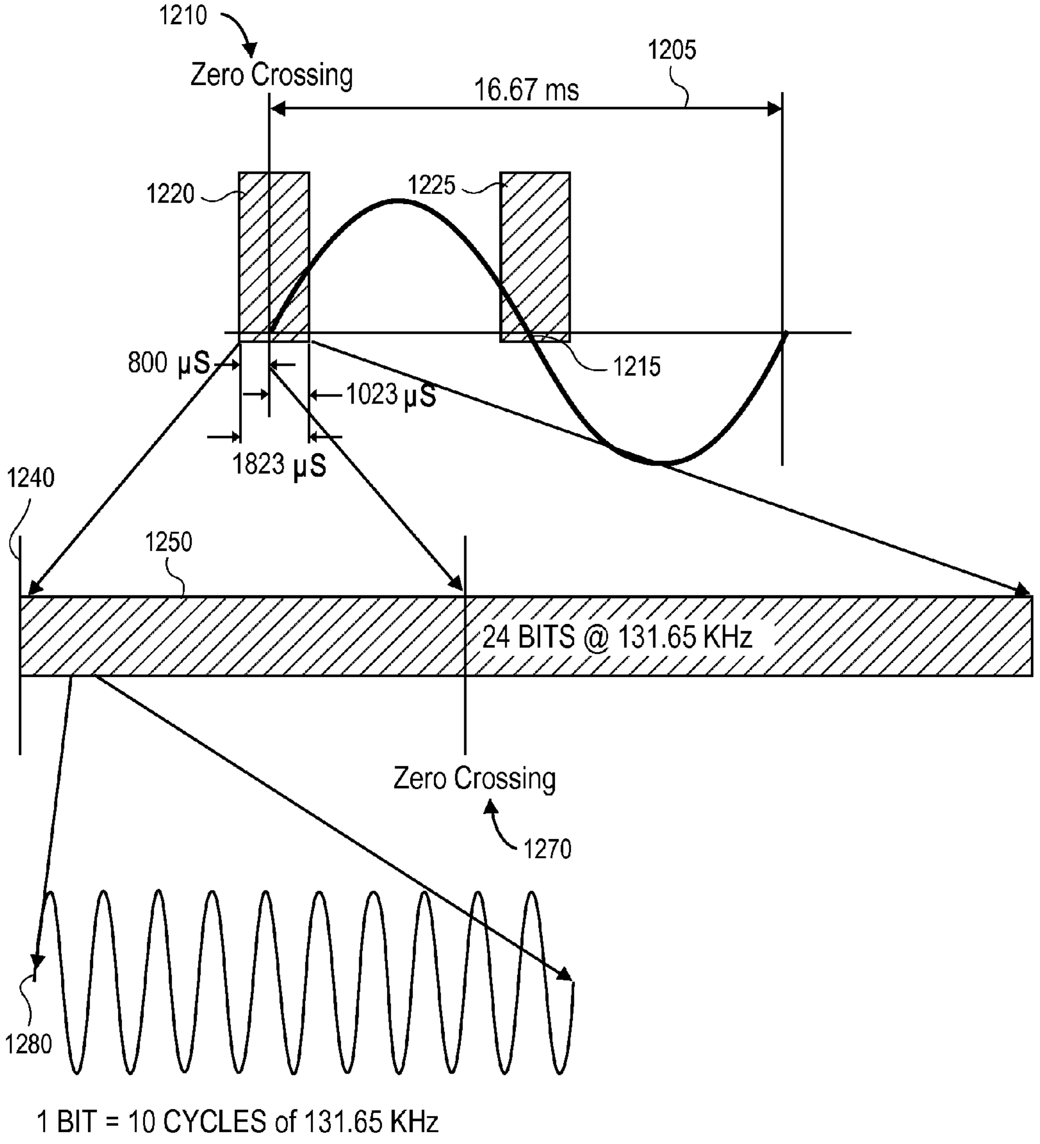
FIG. 12 illustrates powerline signaling applied to the powerline, according to certain embodiments.

FIG. 12 illustrates powerline signaling applied to the powerline. Powerline cycle 1205 possesses two zero crossings 1210 and 1215. A packet 1220 is at zero crossing 1210 and a second packet 1225 is at zero crossing 1215. In an embodiment, the packets 1220, 1225 begin approximately 800 microseconds before a zero crossing and last until approximately 1023 microseconds after the zero crossing.

In some embodiments, the powerline transmission process waits for one or two additional zero crossings after sending a message to allow time for potential RF retransmission of the message by devices 220.

Figure 13:
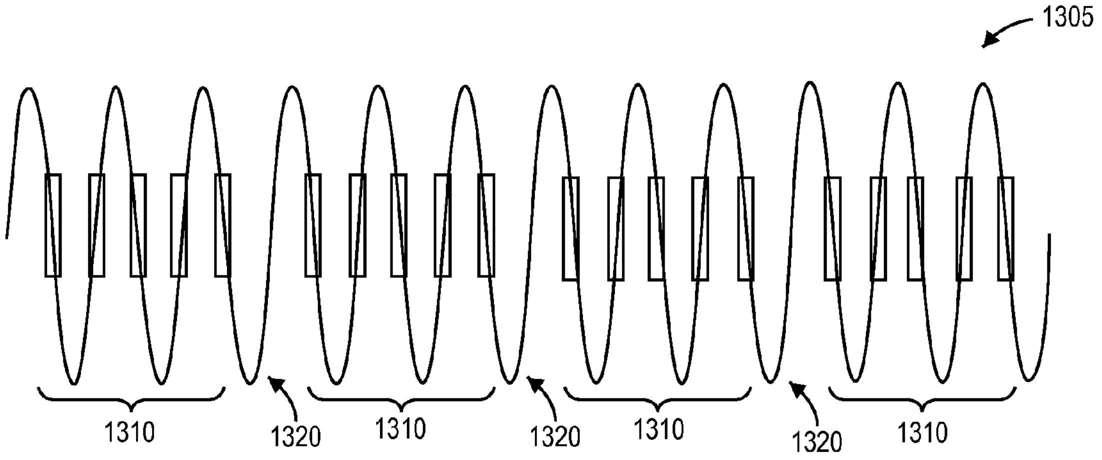
FIG. 13 illustrates standard message packets applied to the powerline, according to certain embodiments.
Figure 14:
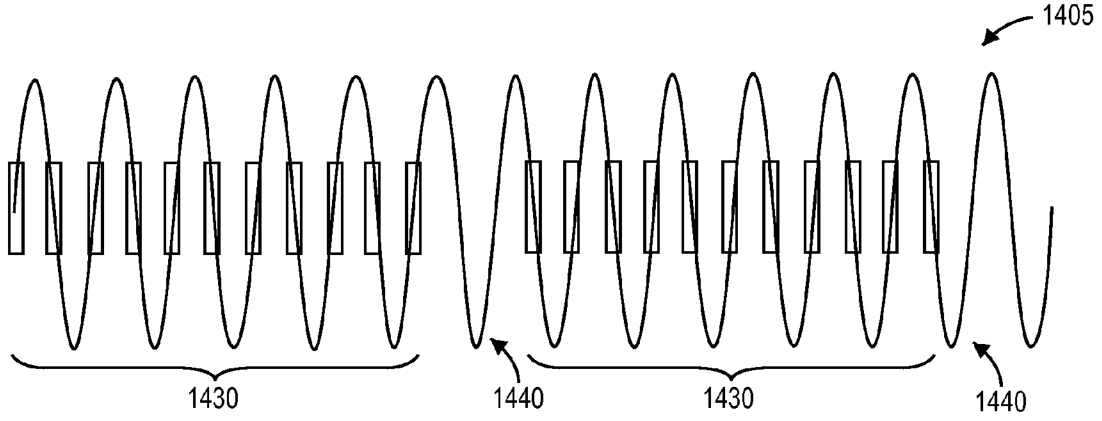
FIG. 14 illustrates extended message packets applied to the powerline, according to certain embodiments.

FIG. 13 illustrates an exemplary series of five-packet standard messages 1310 being sent on powerline signal 1305. In an embodiment, the powerline transmission process waits for at least one zero crossing 1320 after each standard message 1310 before sending another packet. FIG. 14 illustrates an exemplary series of eleven-packet extended messages 1430 being sent on the powerline signal 1405. In another embodiment, the powerline transmission process waits for at least two zero crossings 1440 after each extended message before sending another packet. In other embodiments, the powerline transmission process does not wait for extra zero crossings before sending another packet.

In some embodiments, standard messages contain 120 raw data bits and use six zero crossings, or approximately 50 milliseconds to send. In some embodiments, extended messages contain 264 raw data bits and use thirteen zero crossings, or approximately 108.33 milliseconds to send. Therefore, the actual raw bitrate is approximately 2,400 bits per second for standard messages 1310, and approximately 2,437 bits per second for extended messages 1430, instead of the 2880 bits per second the bitrate would be without waiting for the extra zero crossings 1320, 1440.

In some embodiments, standard messages contain 9 bytes (72 bits) of usable data, not counting packet sync and start code bytes, nor the message CRC byte. In some embodiments, extended messages contain 23 bytes (184 bits) of usable data using the same criteria. Therefore, the bitrates for usable data are further reduced to 1440 bits per second for standard messages 1310 and 1698 bits per second for extended messages 1430. Counting only the 14 bytes (112 bits) of User Data in extended messages, the User Data bitrate is 1034 bits per second.

The devices 220 can send and receive the same messages that appear on the powerline using radio frequency signaling. Unlike powerline messages, however, messages sent by radio frequency are not broken up into smaller packets sent at powerline zero crossings, but instead are sent whole. As with powerline, in an embodiment, there are two radio frequency message lengths: standard 10-byte messages and extended 24-byte messages.

Figure 15:
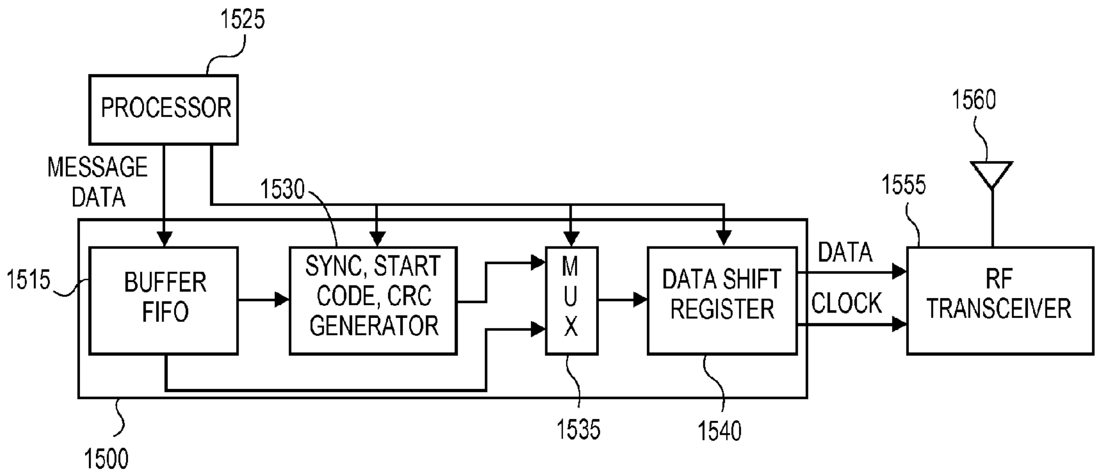
FIG. 15 is a block diagram illustrating the overall flow of information related to transmitting messages via RF, according to certain embodiments.

FIG. 15 is a block diagram illustrating message transmission using radio frequency (RF) signaling comprising processor 1525, RF transceiver 1555, antenna 1560, and RF transmit circuitry 1500. The RF transmit circuitry 1500 comprises a buffer FIFO 1525, a generator 1530, a multiplexer 1535, and a data shift register 1540.

The steps are similar to those for sending powerline messages in FIG. 8, except that radio frequency messages are sent all at once in a single packet. In FIG. 15, the processor 1525 composes a message to send, excluding the CRC byte, and stores the message data into the transmit buffer 1515. The processor 1525 uses the multiplexer 1535 to add sync bits and a start code from the generator 1530 at the beginning of the radio frequency message followed by data shifted out of the first-in first-out (FIFO) transmit buffer 1515.

As the message data is shifted out of FIFO 1515, the CRC generator 1530 calculates the CRC byte, which is appended to the bitstream by the multiplexer 1535 as the last byte of the message. The bitstream is buffered in the shift register 1540 and clocked out to the RF transceiver 1555. The RF transceiver 1555 generates an RF carrier, translates the bits in the message into Manchester-encoded symbols, frequency modulates the carrier with the symbol stream, and transmits the resulting RF signal using antenna 1560. In an embodiment, the RF transceiver 1555 is a single-chip hardware device and the other steps in FIG. 15 are implemented in firmware running on the processor 1525.

Figure 16:
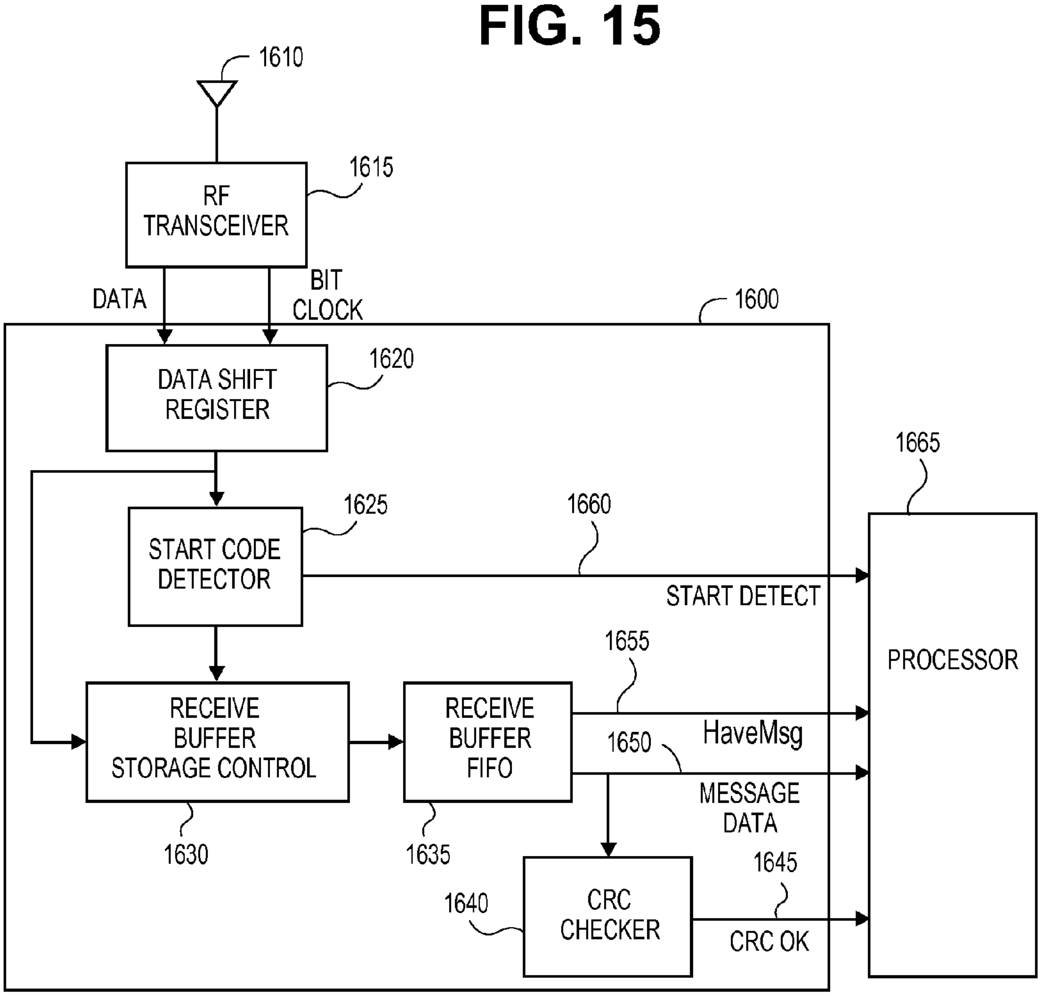
FIG. 16 is a block diagram illustrating the overall flow of information related to receiving messages via RF, according to certain embodiments.

FIG. 16 is a block diagram illustrating message reception using the radio frequency signaling comprising processor 1665, RF transceiver 1615, antenna 1610, and RF receive circuitry 1600. The RF receive circuitry 1600 comprises a shift register 1620, a code detector 1625, a receive buffer storage controller 1630, a buffer FIFO 1635, and a CRC checker 1640.

The steps are similar to those for receiving powerline messages given in FIG. 9, except that radio frequency messages are sent all at once in a single packet. In FIG. 16, the RF transceiver 1615 receives an RF transmission from antenna 1610 and frequency demodulates it to recover the baseband Manchester symbols. The sync bits at the beginning of the message allow the transceiver 1615 to recover a bit clock, which it uses to recover the data bits from the Manchester symbols. The transceiver 1615 outputs the bit clock and the recovered data bits to shift register 1620, which accumulates the bitstream in the message.

The start code detector 1625 looks for the start code following the sync bits at the beginning of the message and outputs a detect signal 1660 to the processor 1665 after it has found one. The start detect flag 1660 enables the receive buffer controller 1630 to begin accumulating message data from shift register 1620 into the FIFO receive buffer 1635. The storage controller 1630 insures that the FIFO receive buffer 1635 stores the data bytes in a message, and not the sync bits or start code. In an embodiment, the storage controller 1630 stores 10 bytes for a standard message and 24 for an extended message, by inspecting the Extended Message bit in the Message Flags byte.

When the correct number of bytes has been accumulated, a HaveMsg flag 1655 is set to indicate a message has been received. The CRC checker 1640 computes a CRC on the received data and compares it to the CRC in the received message. If they match, the CRC OK flag 1645 is set. When the HaveMsg flag 1655 and the CRC OK flag 1645 are both set, the message data is ready to be sent to processor 1665. In an embodiment, the RF transceiver 1615 is a single-chip hardware device and the other steps in FIG. 16 are implemented in firmware running on the processor 1665.

FIG. 17 is a table 1700 of exemplary specifications for RF signaling within the communication network 200. In an embodiment, the center frequency lies in the band of approximately 902 to 924 MHz, which is permitted for non-licensed operation in the United States. In certain embodiments, the center frequency is approximately 915 MHz. Each bit is Manchester encoded, meaning that two symbols are sent for each bit. A one-symbol followed by a zero-symbol designates a one-bit, and a zero-symbol followed by a one-symbol designates a zero-bit.

Symbols are modulated onto the carrier using frequency-shift keying (FSK), where a zero-symbol modulates the carrier by half of the FSK deviation frequency downward and a one-symbol modulates the carrier by half of the FSK deviation frequency upward. The FSK deviation frequency is approximately 64 kHz. In other embodiments, the FSK deviation frequency is between approximately 100 kHz and 200 kHz. In other embodiments the FSK deviation frequency is less than 64 kHz. In further embodiment, the FSK deviation frequency is greater than 200 kHz. Symbols are modulated onto the carrier at approximately 38,400 symbols per second, resulting in a raw data rata of half that, or 19,200 bits per second. The typical range for free-space reception is 150 feet, which is reduced in the presence of walls and other RF energy absorbers.

In other embodiments, other encoding schemes, such as return to zero (RZ), Nonreturn to Zero-Level (NRZ-L), Nonreturn to Zero Inverted (NRZI), Bipolar Alternate Mark Inversion (AMI), Pseudoternary, differential Manchester, Amplitude Shift Keying (ASK), Phase Shift Keying (PSK, BPSK, QPSK), and the like, could be used.

Devices transmit data with the most-significant bit sent first. In an embodiment, RF messages begin with two sync bytes comprising AAAA in hexadecimal, followed by a start code byte of C3 in hexadecimal. Ten data bytes follow in standard messages, or twenty-four data bytes in extended messages. The last data byte in a message is a CRC over the data bytes as disclosed above.

Local Receiver

The local receiver 1800 is configured to communicate with the local controller 2000 and to communicate with the network 200. Unlike the network devices 220, the local receiver 1800 does not have powerline communication capabilities and does not operate on the powerline. Similar to the network devices 220, the local receiver 1800 transmits messages to and receives messages from the network 200. However, unlike the network devices 220, the local receiver 1800 does not operate as a repeater.

The low power receiver 1800 spends the majority of its time asleep in order to conserve power. In an embodiment, the wake-up duty cycle is programmable, depending upon the desired application of the low power receiver 1800. The wake-up interval can range from approximately 100 msec or less to approximately once a day.

Figure 18:
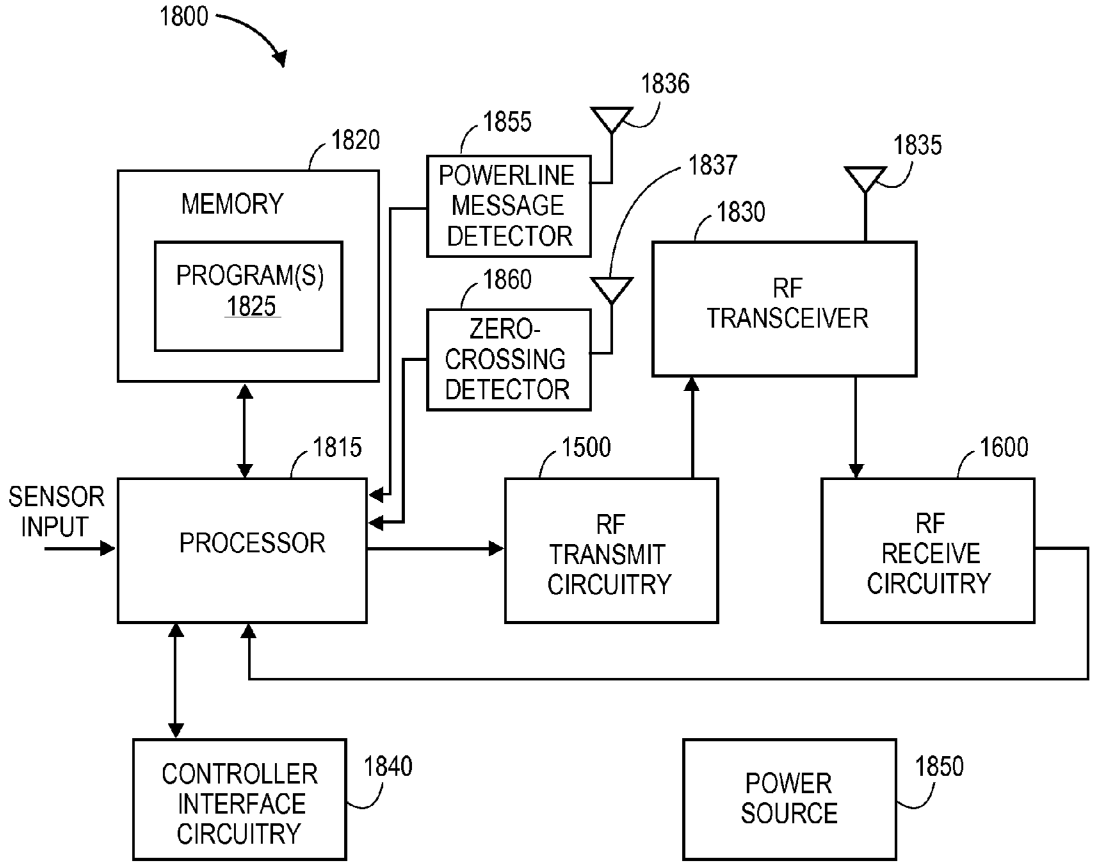
FIG. 18 is block diagram illustrating a local receiver, according to certain embodiments.

FIG. 18 illustrates an embodiment of the local receiver 1800 comprising a processor 1815, memory 1820, an RF transceiver 1830, an antenna 1835, controller interface circuitry 1840, a power source 1850, the RF transmit circuitry 1500 as described above in FIG. 15, and the RF receive circuitry 1600 as described above in FIG. 16. The local receiver 1800 further comprises a powerline message detector 1855, an antenna 1836 associated with powerline message detector, a zero crossing detector 1860, and an antenna 1837 associated with the zero crossing detector 1860. In an embodiment, the local receiver 1800 comprises a low-power receiver.

Processor

The processor circuitry 1815 provides program logic and memory 1820 in support of programs 1825 and intelligence within the local receiver 1800. In an embodiment, the processor circuitry 1815 comprises a computer and the associated memory 1820. The computers comprise, by way of example, processors, program logic, or other substrate configurations representing data and instructions, which operate as described herein. In other embodiments, the processors can comprise controller circuitry, processor circuitry, processors, general purpose single-chip or multi-chip microprocessors, digital signal processors, embedded microprocessors, microcontrollers and the like.

The memory 1820 can comprise one or more logical and/or physical data storage systems for storing data and applications used by the processor 1815 and the program logic 1825. The program logic 1825 may advantageously be implemented as one or more modules. The modules may advantageously be configured to execute on one or more processors. The modules may comprise, but are not limited to, any of the following: software or hardware components such as software object-oriented software components, class components and task components, processes methods, functions, attributes, procedures, subroutines, segments of program code, drivers, firmware, microcode, circuitry, data, databases, data structures, tables, arrays, or variables.

In an embodiment, the processor 1815 executes the programs or rule sets 1825 stored in the memory 1820 to process messages. The RF communications circuits 1500, 1600 use narrow band frequency shift keying (FSK) communications. The processor 1815 receives data from the local controller 2000 via the controller interface circuitry 1840. In an embodiment, the data from the local controller 2000 comprises a serial bit stream. The processor 1815 composes a message based at least in part on the data received from the local controller 2000. The processor 1815 sends the message to the RF transmit circuitry 1500, where the message is encoded using FSK onto a baseband signal, which is up converted and transmitted from antenna 1835 to other devices 220 on the network 200.

In addition, the antenna 1835 receives RF signals from at least one device 220 on the network 200 which are down converted to a baseband FSK encoded signal and decoded by the RF receive circuitry 1600. The processor circuitry 1815 receives and processes the decoded message into commands and/or data for the local controller 2000. The processor 1815 send commands and/or data to the local controller 2000 via the controller interface circuitry 1840. In an embodiment, the commands and/or data to the local controller 2000 comprises a serial bit stream.

In other embodiments, the programming 1825 may include processes to conserve power consumed by the low power receiver 1800. Such processes may periodically cause the processor 1815 to check for messages from the network 200 that are addressed to it and/or to check for messages or data from the local controller 2000. In an embodiment, the processor 1815 receives one or more inputs, such as interrupts or the like, from one or more sensors, such as a motion sensor, a touch keypad, or the like.

Radio Frequency (RF) Communications

In an embodiment, the RF transmit circuitry 1500 comprises the buffer FIFO 1525, the generator 1530, the multiplexer 1535, and the data shift register 1540, as describe above with respect to FIG. 15, and the RF receive circuitry 1600 comprises the shift register 1620, the code detector 1625, the receive buffer storage controller 1630, the buffer FIFO 1635, and the CRC checker 1640, as described above with respect to FIG. 16.

Similar to the operation described above in FIG. 15, the processor 1815 composes a message to send, excluding the CRC byte, and stores the message data into the transmit buffer 1515. The processor 1815 uses the multiplexer 1535 to add sync bits and a start code from the generator 1530 at the beginning of the radio frequency message followed by data shifted out of the first-in first-out (FIFO) transmit buffer 1515. As the message data is shifted out of FIFO 1515, the CRC generator 1530 calculates the CRC byte, which is appended to the bitstream by the multiplexer 1535 as the last byte of the message. The bitstream is buffered in the shift register 1540 and clocked out to the RF transceiver 1555. The RF transceiver 1555 generates an RF carrier, translates the bits in the message into Manchester-encoded symbols, FM modulates the carrier with the symbol stream, and transmits the resulting RF signal using antenna 1835. In an embodiment, the FM carrier is approximately 915 MHz.

Similar to the operation described above in FIG. 16, the RF transceiver 1615 receives an RF transmission from antenna 1835, which is tuned to approximately 915 MHz, and FM demodulates it to recover the baseband Manchester symbols. The sync bits at the beginning of the message allow the transceiver 1615 to recover a bit clock, which it uses to recover the data bits from the Manchester symbols. The transceiver 1615 outputs the bit clock and the recovered data bits to shift register 1620, which accumulates the bitstream in the message. The start code detector 1625 looks for the start code following the sync bits at the beginning of the message and outputs a detect signal 1660 to the processor 1665 after it has found one.

The start detect flag 1660 enables the receive buffer controller 1630 to begin accumulating message data from shift register 1620 into the FIFO receive buffer 1635. The storage controller 1630 insures that the FIFO 1635 stores the data bytes in a message, and not the sync bits or start code. The storage controller 1630 stores 10 bytes for a standard message and 24 for an extended message, by inspecting the Extended Message bit in the Message Flags byte. When the correct number of bytes has been accumulated, a HaveMsg flag 1655 is set to indicate a message has been received. The CRC checker 1640 computes a CRC on the received data and compares it to the CRC in the received message. If they match, the CRC OK flag 1645 is set. When the HaveMsg flag 1655 and the CRC OK flag 1645 are both set, the message data is ready to be sent to processor 1815.

Powerline Message Detection

The powerline message detector 1855 and associated antenna 1836 are configured to detect activity on the powerline, and based on the activity on the powerline, the local receiver 1800 checks for network messages. In an embodiment, the local receiver 1800 "sleeps" most of the time to conserve power and "wakes up" when there is message activity on the powerline. Once the local receiver 1800 is alerted to message activity, it checks for messages addressed to it. If there are no messages addressed to it, the local receiver 1800 goes back to the power conserving mode.

As described above, network messages are sent over the powerline by modulating the data onto a carrier signal which is added to the powerline signal. The carrier signal generates an electromagnetic field which can be detected by a tuned antenna. In an embodiment, the carrier signal is approximately 131.65 kHz and the antenna 1836 is tuned to approximately 131.65 kHz±2%. In other embodiments, the antenna 1836 is tuned to approximately the same frequency as the carrier signal. In further embodiments, the antenna 1836 is tuned to approximately 131.65 kHz±0.05%. In other embodiments, the percentage deviation ranges between ±0.01% to ±5%. When the antenna 1836 detects the electromagnetic field generated by the carrier signal in the powerline messages, the powerline message detector 1855 alerts the local receiver 1800 to check for network messages. In an embodiment, the powerline message detector 1855 sends an interrupt to the processor 1815 when the antenna 1836 detects the carrier signal.

Zero Crossing Detection

The zero crossing detector 1860 and associated antenna 1837 are configured to detect the zero crossing of the powerline, and based on the zero crossing, the local receiver 1800 synchronizes with the network 200 to send messages to the hub 250 via the network 200 at the appropriate time. Common examples of the powerline voltage are nominally 110 VAC alternating at 60 Hz, nominally 230 VAC alternating at 50 Hz, and the like. In an embodiment, the antenna 1837 is tuned to approximately 60 Hz±approximately 20 Hz. In another embodiment, the antenna 1837 is turned to approximately 50 Hz±approximately 20 Hz. In a further embodiment, the antenna 1837 is tuned to between approximately 40 Hz and approximately 100 Hz. In these cases, the antenna 1837 detects the presence of the electromagnetic field generated by the alternating of the powerline voltage. The zero crossing detector 1860 identifies the powerline zero crossing based on the input from the antenna 1837 and alerts the local receiver 1800. In an embodiment, the zero crossing detector 1860 sends an interrupt to the processor 1815 when the antenna 1837 detects the frequency of the alternating current of the powerline.

Controller Interface Circuitry

In an embodiment, the local controller 2000 sends an interrupt to the processor circuitry 1815 via the controller interface circuitry 1840 to indicate that there is data from the local controller 2000 to send to the hub 250. The local receiver 1800 receives the data over a serial communication bus from the local controller 2000. In another embodiment, the local receiver 1800 sends an interrupt to the local controller 2000 via the controller interface circuitry 1840 to indicate that there is a message from the hub 250 for the local controller 2000. In an embodiment, the local receiver 1800 and the local controller 2000 communicate using logic level serial communications, such as, for example, Inter-Integrated Circuit ($I^2C$), Serial Peripheral Interface (SPI) Bus, an asynchronous bus, and the like.

Power Source

In an embodiment, the power source 1850 comprises a battery and a regulator to regulate the battery voltage to approximately 5 volts to power the circuitry 1815, 1820, 1830, 1840, 1500, 1600. As described above, the local receiver 1800 spends the majority of its time asleep in order to conserve power and the wake-up duty cycle can be programmable. The amount of time the local receiver 1800 spends asleep versus the amount of time it operates affects the power source 1850. For example, some applications of the low power receiver 1800 require faster response times and as a result, these low power receivers 1800 comprise a higher capacity power source 1850, such as a larger battery, or more frequent power source replacement. In another example, other applications of the low power receiver 1800 have much less frequent response times and have a very long power source life.

In an embodiment, the battery comprises an approximately 1 ampere-hour battery. In other embodiments, the battery capacity is greater than 1 ampere-hour or less than 1 ampere-hour. Embodiments of the battery can be rechargeable or disposable. In other embodiments, the power source 1850 comprises other low voltage sources, AC/DC converters, photovoltaic cells, electro-mechanical batteries, standard on-time use batteries, and the like.

Figure 19A:
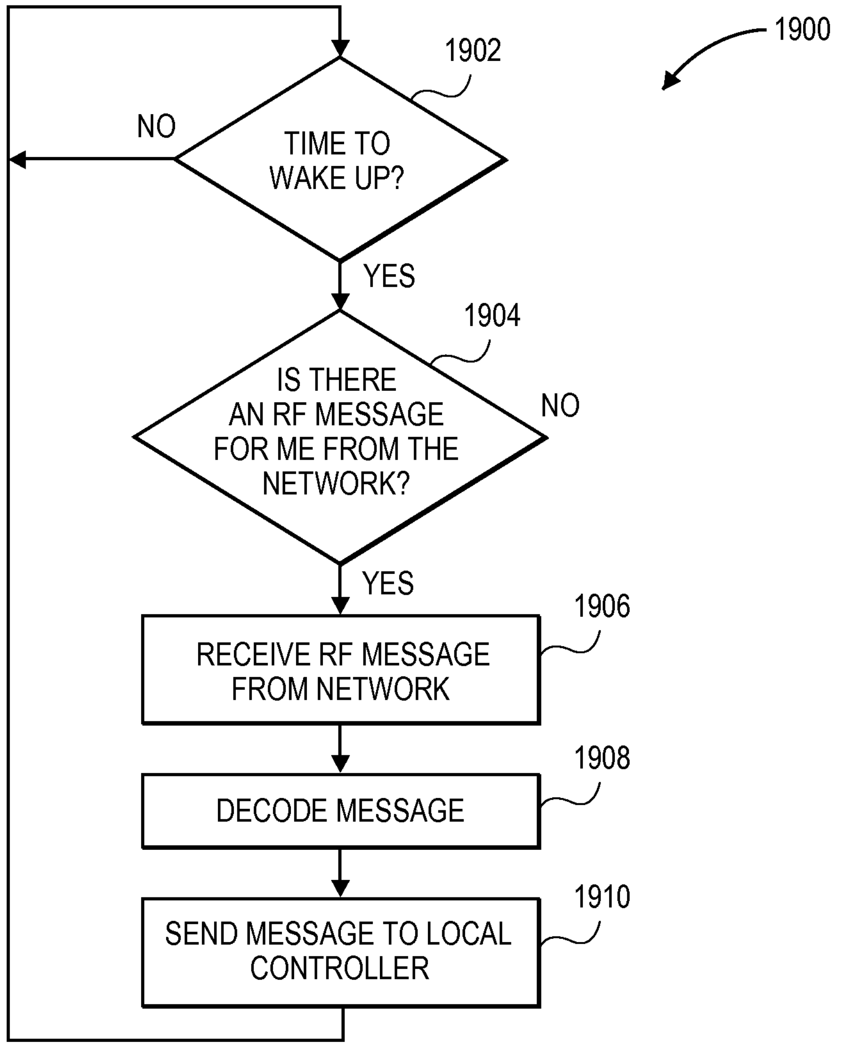
FIG. 19A illustrates a process used by the local receiver to receive messages from the network and send messages to the local controller, according to certain embodiments.

FIG. 19A illustrates a process 1900 used by the local receiver to send messages from the network 200 to the local controller 2000. In order to conserve power, the local receiver 1800 spends the majority of the time asleep or in a low power mode and periodically checks for messages addressed to it. At step 1902, the local receiver 1800 waits in a low-power or sleep mode until the process 1900 determines that it is time to wake-up the local receiver 1800. If it is not time to wake-up the processor 1815, the process 1900 returns to step 1902.

In an embodiment, the sleep interval or in other words, the wake-up duty cycle, is user programmable and the user can choose from several embodiments to wake-up the local receiver 1800.

For example, in one embodiment, the process 1900 alerts the local receiver 1800 to the occurrence of the powerline or AC sine wave zero-crossing. The antenna 1837 detects the electromagnetic field generated by the alternating current of the powerline and the zero-crossing detector 1860 alerts the processor 1815 to the zero-crossings. The local receiver 1800 or the zero-crossing detector 1860 can further comprise a counter to count to a user programmable number of detected zero-crossings before sending the interrupt to the processor 1815. The counter can be implemented in the programming 1825 or can be implemented as hardware. For example, for a 60 Hz alternating current power signal, the processor 1815 could be interrupted at each zero-crossing which is approximately 120 times per second. A counter implemented to count to 432,000, for example, would generate an interrupt approximately one per hour. In other embodiments, a counter could be implemented to generate an interrupt once a day, more often than once a day, or less often than once a day, based on the count of the detected zero-crossings of the AC powerline.

In another embodiment, the process 1900 alerts the local receiver 1800 to the presence of message traffic on the powerline. The antenna 1836 detects the presence of the powerline signal carrier that radiates into free space. In an embodiment, the powerline message detector 1855 sends an interrupt to the processor 1815 when the antenna 1836 detects the electromagnetic field generated by the carrier signal. The interrupt wakes-up the processor 1815.

In a further embodiment, the process 1900 alerts the local receiver 1800 to the presence of message traffic on the powerline and wakes-up the processor 1815 for approximately 800 msec before the zero-crossing, when the powerline messages are sent. As described above, the powerline message detector 1855 and the antenna 1836 detect the RF carrier signal and the zero-crossing detector 1860 and the antenna 1837 detect the zero-crossing of the AC powerline. The local receiver 1800 further comprises a gating function to gate the indication of the powerline message activity and the indication of the powerline zero-crossing to provide the interrupt to the processor 1815. The interrupt wakes-up the local receiver 1800 at the INSTEON® message time which is approximately 800 msec before the powerline zero-crossing.

In another embodiment, the processor 1815 receives an interrupt from a sensor when the sensor is activated. The interrupt wakes-up the processor 1815. Examples of sensors are a motion sensor, a touch key pad, a proximity sensor, a temperature sensor, an acoustic sensor, a moisture sensor, a light sensor, a pressure sensor, a tactile sensor, a barometer, an alarm sensor, and the like.

In yet another embodiment, the local receiver 1800 comprises a software timer implemented in the programming 1825. The process 1900 checks the status of the timer. In an embodiment, the process 1900 wakes up the local receiver 1800 approximately every 100 msec to check for messages from the network 200. In another embodiment, the process 1900 wakes up the local receiver 1800 between approximately 100 msec and approximately 1000 msec to check for messages. In a further embodiment, the wake-up interval can range from 100 msec and below to approximately once per day.

At step 1904, the local receiver 1800 has woken up, and the process 1900 checks if there is at least one RF message from the network 200 that comprises the address of the local receiver 1800. In an embodiment, the RF transceiver 1830 receives the RF signals through the antenna 1837. In an embodiment, the processor 1815 checks the RF receive circuitry 1600 for received messages. If there is not a message addressed to the local receiver 1800, the process 1900 returns to step 1902.

If there is a message addressed to the local receiver 1800, the process 1900 moves to step 1906. At step 1906, the process 1900 receives the RF message from the network 200. In an embodiment, the processor 1815 receives the message from the RF receive circuitry 1600. And at step 1908, the process 1900 decodes the message. In an embodiment, the receiver 1600 demodulates the RF message and sends the message data to the processor 1815.

At step 1910, the process 1900 sends the information decoded from the received RF message to the local controller 2000 to be processed. In an embodiment, the processor 1815 formats the decoded information as a serial bit stream and sends the serial bit stream via the controller interface circuitry 1840 to the local controller 2000. In an embodiment, the information comprises at least one command and the local controller 2000 performs the command.

Figure 19B:
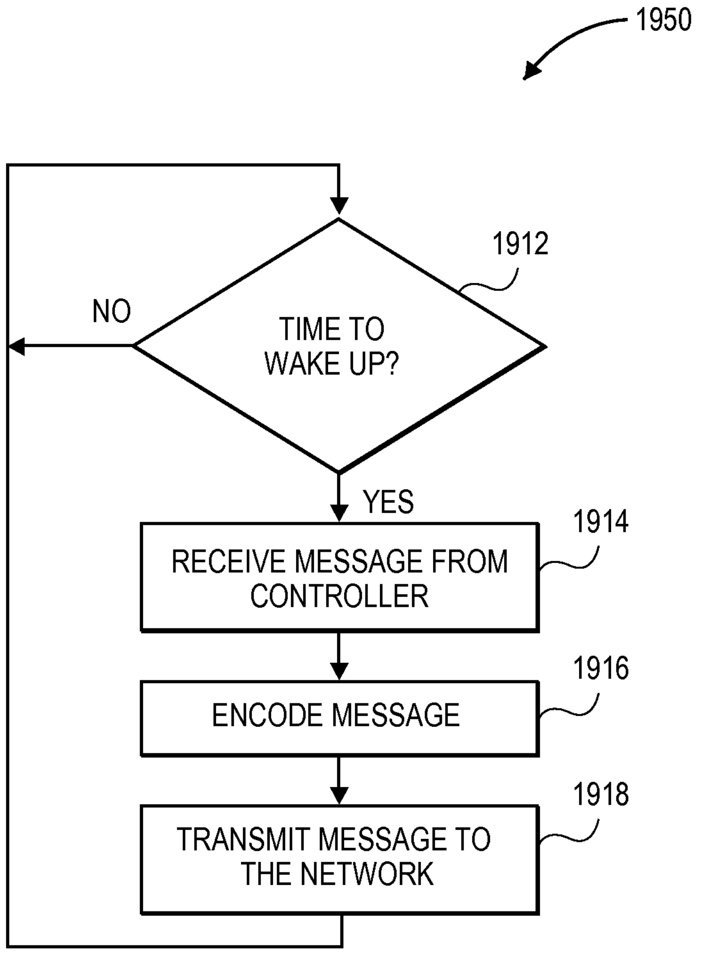
FIG. 19B illustrates a process used by the local receiver to receive messages from the local controller and send messages to the network, according to certain embodiments.

FIG. 19B illustrates a process 1950 used by the local receiver 1800 to send messages from the local controller 2000 to the network 200. In order to conserve power, the local receiver 1800 spends the majority of the time asleep or in a low power mode and waits for data from the local controller 2000. At step 1912, the local receiver 1800 waits in a low-power or sleep mode until the process 1900 determines that it is time to wake-up the local receiver 1800.

In one embodiment, step 1912 is the same as step 1902 in FIG. 19A. After the process 1900 sends a message to the local controller 2000 at step 1910, or concurrent with steps 1904-1910, the process 1950 moves to step 1914 in FIG. 19B and checks for at least one message from the local controller 2000. If there is no message from the local controller 2000, the process 1950 returns to step 1912.

In another embodiment, at step 1912, the processor 1815 waits for an interrupt from the local controller 2000 via the controller interface circuitry 1840. If there is no interrupt, the process 1950 returns to step 1912. The interrupt indicates that the local controller 2000 has a message to send to the hub 250 via the network 200 and the local receiver 1800.

At step 1914, the process 1950 receives the message from the local controller 2000. In an embodiment, the processor 1815 receives the message from the controller interface circuitry 1840. In an embodiment, the message comprises serial data.

And at step 1916, the process 1950 encodes the data from the controller 2000 for RF transmission to the network 200. In an embodiment, the processor 1815 receives the serial data from the controller interface circuitry 1840 and formats the serial data into messages. In an embodiment, the RF transmit circuitry 1500 modulates the message onto the RF signal.

At step 1918, the process 1950 transmits the modulated RF signal to the network 200. In an embodiment, the antenna 1837 detects the electromagnetic field generated by the powerline alternating current and the zero crossing detector 1860 determines the zero crossings of the powerline. Detecting the zero crossing time of the powerline provides the local receiver 1800 with the ability to synchronize to the message traffic on the powerline. The zero crossing detector 1860 sends the information relating to the zero crossings of the powerline to the processor 1815. In an embodiment, the transmitter 1500 transmits the modulated RF signal to the network 200 based at least in part on the zero crossing times of the powerline. In an embodiment, the RF transceiver 1830 transmits the modulated RF signal through the antenna 1835 to the network 200.

Window Covering Controller

Figure 20:
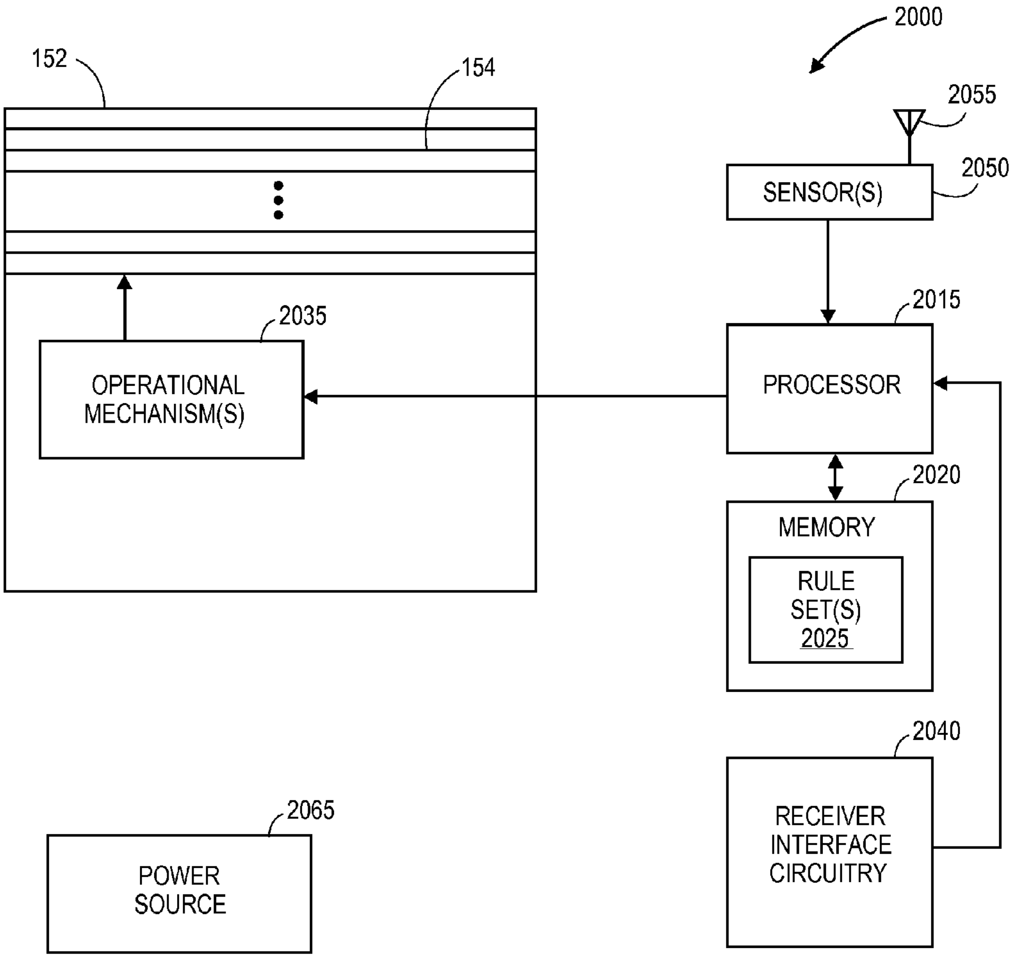
FIG. 20 is a block diagram illustrating a window covering controller, according to certain embodiments.

FIG. 20 is a block diagram illustrating the window covering controller 2000 comprising the electronic window covering 152, receiver interface circuitry 2040, a processor 2015 and associated memory 2020, one or more sensors 2050, and a power source 2065.

Processor

The processor circuitry 2015 provides program logic and memory 2020 in support of programs 2025 and intelligence within the local controller 2000. Further, the processor 2015 formats data to send to the local receiver 1800 and receives commands and/or data from the local receiver 1800.

In an embodiment, the processor circuitry 2015 comprises a computer and the associated memory 2020. The computers comprise, by way of example, processors, program logic, or other substrate configurations representing data and instructions, which operate as described herein. In other embodiments, the processors can comprise controller circuitry, processor circuitry, processors, general purpose single-chip or multi-chip microprocessors, digital signal processors, embedded microprocessors, microcontrollers and the like.

The memory 2020 can comprise one or more logical and/or physical data storage systems for storing data and applications used by the processor 2015 and the program logic 2025. The program logic 2025 may advantageously be implemented as one or more modules. The modules may advantageously be configured to execute on one or more processors. The modules may comprise, but are not limited to, any of the following: software or hardware components such as software object-oriented software components, class components and task components, processes methods, functions, attributes, procedures, subroutines, segments of program code, drivers, firmware, microcode, circuitry, data, databases, data structures, tables, arrays, or variables.

In an embodiment, the local receiver 1800 comprises the window covering controller 2000, such that the processor 1815 comprises the processor 2015 and the memory 1820 comprises the memory 2020.

Electronic Window Covering

In an embodiment, the electronic window covering 152 comprises a covering configured to cover and uncover an associated window where the covering raises to uncover the window and lowers to cover the window. In an embodiment, the electronic window covering 152 comprises an electronic window blind comprising the plurality of slates 154. In addition to raising and lowering the slates 154 to cover and uncover the window, the electronic window blind 154 is further configured to rotate or tilt the slats 154 between an open position where the slats allow light to enter through the window and a closed position where the slats 154 prohibit light from entering through the window.

The electronic window covering 152 further comprises one or more operational mechanisms 2035 configured to operate the covering and the slats 154. For example, the operational mechanisms 2035 comprise tubular motors, stepper motors, and the like to open/close, raise/lower, and tilt/rotate the covering and/or the slats 154. Further, the operational mechanisms 2035 interface with the processor 2015 and the processor 2015 controls the operational mechanisms 2035.

In an embodiment, the processor 2015 interfaces with the operational mechanisms 2035 through a serial data port and transmits operational commands to control the motors. The operational mechanisms 2035 receive the serial data and decode the data to form the operational commands. In another embodiment, the processor 2015 provides one or more control signals to the operational mechanisms 2035 to energize/de-energize the motors in order to operate the electronic window covering 152.

The processor 2015 also receives commands and/or data from the local receiver 1800. Based at least in part on the received commands and/or data, the processor 2015 controls the operational mechanisms 2035 to adjust the window covering and/or slats 154.

Sensors

The sensors 2050 comprise one or more sensors. In an embodiment, the one or more sensors 2050 comprise a light level sensor or a photosensor. Examples of photosensors are, but not limited to, photo diodes, LED reverse-biased to operate as photo diodes, photovoltaic cells, solar cells, phototubes, phototransistors, photoresistors, charge-coupled devices, and the like. The photosensors are configured to detect the prevailing light level, luminance or brightness in a space, such as a room having a window and its associated electronic window covering 152. The light level sensor 2050 can be positioned exterior to the space to detect the total amount of light available, or inside the space to detect both daylight and electric sources in the space. For example, in an office, the light sensor 2050 can be positioned on the ceiling facing the desktops in order to detect the amount of light on the work surface.

In another embodiment, the one or more sensors 2050 comprise a temperature sensor. Examples of temperature sensors are, but not limited to, thermistors, thermocouples, resistance thermometers, silicon bandgap temperature sensors, and the like. The temperature sensors 2050 are configured to detect the temperature in the space having the window and its associated electronic window covering 152.

In another embodiment, the one or more sensors 2050 comprise sensors to detect the presence of a person or a specific individual. The sensor 2050 may comprise an RF envelope detector and an antenna 2055 to detect the presence of a cellphone. In a further embodiment, the sensor 2050 comprises a Bluetooth receiver and the antenna 2055 recognizes the mobile phone number of a cell phone within range of the receiver. In another embodiment, the sensor 2050 comprises a Wi-Fi (IEEE 802.11 standard) receiver and the antenna 2055 recognizes a transmission through a local wireless local area network (WLAN). In a further embodiment, the sensor 2050 comprises a cellular modem and the antenna 2055 provides a wireless connection to a cellular carrier for data transfer. In a yet further embodiment, the sensor 2050 interfaces with a geolocation service to determine when a cellphone is near. In yet another embodiment, the sensor 2050 comprises image recognition device(s) and image recognition software to recognize an individual.

In another embodiment, the sensor 2050 comprises a motion sensor, such as, for example, a pinhole motion detector, to detect the motion of an approaching person. In another embodiment, the sensor comprises a proximity switch, such as for example, a resistance touch switch, a capacitance touch switch, a piezo electric touch switch, and the like.

Receiver Interface Circuitry

In an embodiment, the processor 2015 via the receiver interface circuitry 2040 sends an interrupt to the processor circuitry 1815 to indicate that there is data ready to send to the hub 250. In another embodiment, the processor 1815 sends an interrupt via the receiver interface circuitry 2040 to the processor 2015 to indicate that there is a message from the hub 250 for the window covering controller 2000. In an embodiment, the local receiver 1800 and the window covering controller 2000 communicate using logic level serial communications, such as, for example, Inter-Integrated Circuit ($I^2C$), Serial Peripheral Interface (SPI) Bus, an asynchronous bus, and the like.

Power Source

In an embodiment, the power source 2065 comprises a battery and a regulator to regulate the battery voltage to approximately 5 volts to power the circuitry 2015, 2020, 2035, 2040, 2050. In an embodiment, the battery comprises an approximately 1 ampere-hour battery. In other embodiments, the battery capacity is greater than 1 ampere-hour or less than 1 ampere-hour. Embodiments of the battery can be rechargeable or disposable. In an embodiment, the power source 1850 in the local receiver 1800 comprises the power source 2065 and powers the window covering controller 2000.

Window Covering Control System

In an embodiment, a window covering control system comprising the window covering controller 2000, the local receiver 1800, the network 200 and the hub 250 is configured to adjust the window covering 152 in response to changing daylight availability, temperature, time of day, occupancy of the space, use of the space, and the like.

Daylight Harvesting

Daylight harvesting refers to the use of daylight to offset the amount of electric lighting needed to properly illuminate a space, in order to reduce energy consumption. In an embodiment, the sensors 2050 comprise light intensity sensors 2050 and send sensor data comprising light intensity information to the processor 2015.

The processor 2015 transmits the light intensity information to the local controller 1800, which formats a message and sends the message to the hub 250 through the network 200. The hub 250 receives the message and provides window covering commands based at least in part on the light intensity information. The hub 250 transmits a message comprising the window covering command through the network 200 to the local controller 1800. The local controller 1800 receives the message from the network 200 and sends the window covering command to the window covering controller 2000. The window covering controller 2000 adjusts, raise, lowers, rotates and/or tilts the window covering 152 based at least in part on the window covering command.

In a further embodiment, the network 200 comprises one or more lighting devices associated with the space and the hub 250 transmits lighting commands through the network 200 to the lighting devices to turn on, turn off, or dim the lighting devices based at least in part on the light intensity information from the sensors 2050.

Figure 21:
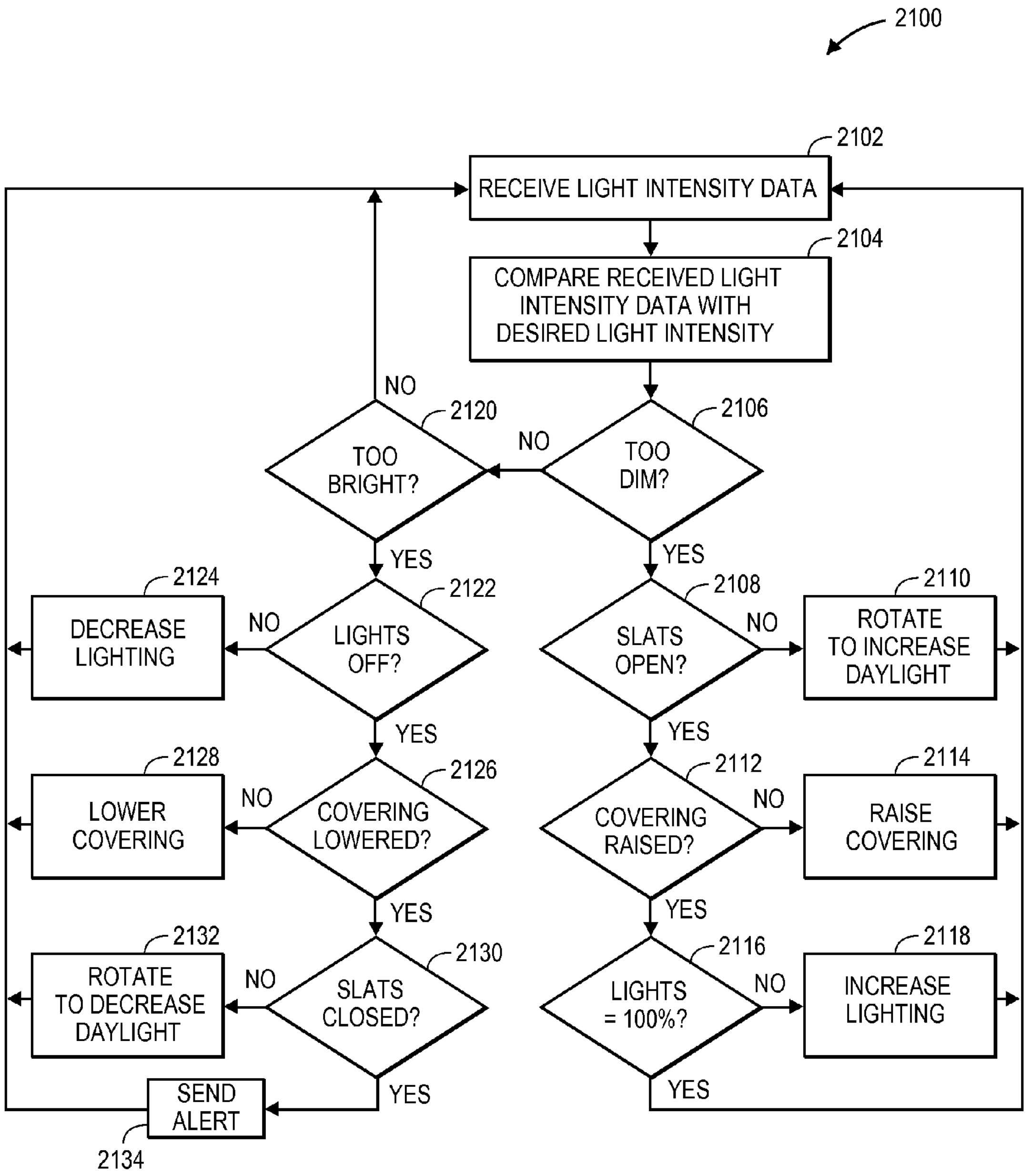
FIG. 21 illustrates a process to automatically control an electronic window covering based at least in part on light intensity, according to certain embodiments.

FIG. 21 illustrates a process 2100 to control lighting devices and window coverings 152 based at least in part on the light intensity data. At step 2102, the process 2100 receives the light intensity data measured by the sensors 2050.

At step 2104, the process 2100 compares the measured light intensity data with the desired light intensity for a space associated with the window covering 152. The desired light intensity may take into account the time of day, the occupancy of the space, the use of the space, user preferences, and the like. For example, a desired daytime light intensity does not need to be maintained when the space is not occupied, such as in the middle of the night.

At step 2106, the process 2100 determines if the measured light intensity is too dim or less than the desired light intensity. If the measured light intensity is less than the desired light intensity, the process 2100 moves to step 2108, where the process 2100 determines whether the slats 154 are open.

If the slats 154 are not open, the process 2100 at step 2110 sends a window covering command to the window covering controller 2000 to rotate the slats 154 on the window covering 152 to increase the daylight entering the space. In an embodiment, the hub 250 sends the window covering command through the network 200 and the local controller 1800 to the window covering controller 2000. The process 2100 then moves to step 2102 to receive new light intensity data.

If the slats 154 are open, the process 2100 at step 2112 determines whether the window covering 152 is raised. If the window covering 152 is lowered, the process 2100 at step 2114 sends a window covering command to the window covering controller 2000 to raise the window covering 152 to increase the daylight entering the space. In an embodiment, the hub 250 sends the window covering command through the network 200 and the local controller 1800 to the window covering controller 2000. The process 2100 then moves to step 2102 to receive new light intensity data.

If the window covering 152 is raised, the process 2100 at step 2116 determines if the electrical lighting is turned on. If the electrical lighting is not on or is turned on but dimmed, the process at step 2118 sends a command to lighting devices on the network 200 associated with the space to turn on or to decrease any dimming to increase the light in the space. The process 2100 then moves to step 2102 to receive new light intensity data.

Referring to step 2106, if the measured light intensity is not less than the desired light intensity, the process 2100 moves to step 2120. At step 2120, the process 2100 determines if the measured light intensity is too bright or greater than the desired light intensity. If the measured light intensity is within a selected percentage of the desired light intensity, such that the measured light intensity is neither too bright nor too dim, the process 2100 moves to step 2102 to receive new light intensity data. In an embodiment, the selected percentage is approximately ±5%, preferably ±2%, and more preferably ±0.5%. In other embodiments, the selected percentage is approximately ±10%.

If the measured light intensity is greater than the desired light intensity, the process 2100 moves to step 2122, where the process 2100 determines whether the electric lighting is turned off or dimmed. If the electric lighting is not turned off, the process 2100 at step 2124 sends a command to the lighting devices on the network 200 associated with the space to turn off or to increase any dimming to decrease the light in the space. The process 2100 then moves to step 2102 to receive new light intensity data.

If the electric lighting is off, the process 2100 at step 2126 determines whether the window coverings 152 are lowered. If the window coverings 152 are raised, the process 2100 at step 2128 send a command to the window covering controller 2000 to lower the window coverings 152 to decrease the daylight entering the space. In an embodiment, the hub 250 sends the window covering command through the network 200 and the local controller 1800 to the window covering controller 2000. The process 2100 then moves to step 2102 to receive new light intensity data.

If the window coverings are lowered, the process 2100 at step 2130 determines whether the slats 154 are closed. If the slats 154 are open, the process 2100 at step 2132 send a command to the window covering controller 2000 to close the slats 154 to decrease the daylight entering the space. In an embodiment, the hub 250 sends the window covering command through the network 200 and the local controller 1800 to the window covering controller 2000. The process 2100 then moves to step 2102 to receive new light intensity data.

If the slats 154 are closed at step 2130, the process 2100 sends an alert to a user indicating that no adjustments were made. The process 2100 then moves to step 2102 to receive new light intensity data.

Temperature Adjustment

Sunlight entering a space through a window provides heat. Conversely, windows provide a path for heat to exit a space when the temperature is colder outside than inside. Window coverings 152 can reduce energy use by reducing heat loss in the winter and heat gain in the summer. They can also be adjusted to block and reflect direct sunlight onto a light-colored ceiling. A light-colored ceiling will diffuse the light without much heat or glare. In an embodiment, the sensors 2050 comprise temperature sensors 2050 and send sensor data comprising temperature information to the processor 2015.

The processor 2015 transmits the temperature information to the local controller 1800, which formats a message and send the message to the hub 250 through the network 200. The hub 250 receives the message and provides window covering commands based at least in part on the temperature information. The hub 250 transmits a message comprising the window covering command through the network 200 to the local controller 1800. The local controller 1800 receives the message from the network 200 and sends the window covering command to the window covering controller 2000. The window covering controller 2000 adjusts, raise, lowers, rotates and/or tilts the window covering 152 based at least in part on the window covering command.

In a further embodiment, the network 200 comprises one or more thermostats associated with the space and the hub 250 transmits temperature control commands through the network 200 to the thermostat to adjust the temperature setting based at least in part on the temperature information from the sensors 2050.

Figure 22:
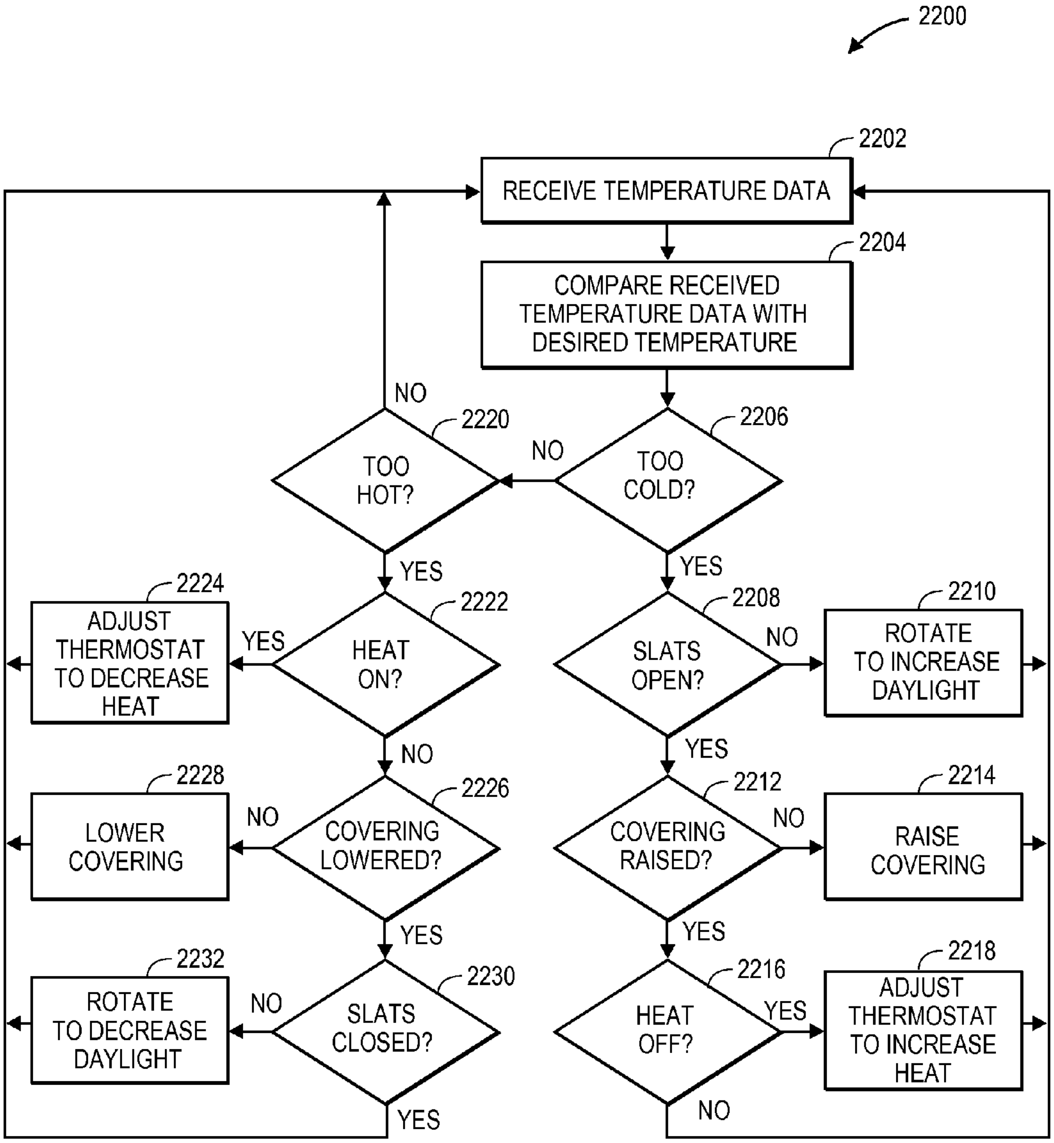
FIG. 22 illustrates a process to automatically control an electronic window covering based at least in part on temperature, according to certain embodiments.

FIG. 22 illustrates a process 2200 to control thermostats and window coverings 152 based at least in part on the temperature data. At step 2202, the process 2200 receives the temperature data measured by the sensors 2050.

At step 2204, the process 2200 compares the measured temperature data with the desired temperature for a space associated with the window covering 152. The desired temperature may take into account the time of day, the occupancy of the space, the use of the space, user preferences, and the like. For example, a desired daytime temperature does not need to be maintained when the space is not occupied, such as in the middle of the night.

At step 2206, the process 2200 determines if the measured temperature is too cold or less than the desired temperature. If the measured temperature is less than the desired temperature, the process 2200 moves to step 2208, where the process 2200 determines whether the slats 154 are open.

If the slats 154 are not open, the process 2200 at step 2210 sends a window covering command to the window covering controller 2000 to rotate the slats 154 on the window covering 152 to increase the sunlight heating the space. In an embodiment, the hub 250 sends the window covering command through the network 200 and the local controller 1800 to the window covering controller 2000. The process 2100 then moves to step 2102 to receive new temperature data.

If the slats 154 are open, the process at step 2212 determines whether the window covering 152 is raised. If the window covering 152 is lowered, the process 2200 at step 2214 sends a window covering command to the window covering controller 2000 to raise the window covering 152 to increase the sunlight heating the space. In an embodiment, the hub 250 sends the window covering command through the network 200 and the local controller 1800 to the window covering controller 2000. The process 2200 then moves to step 2202 to receive new temperature data.

If the window covering 152 is raised, the process 2200 at step 2216 determines if the heating is turned off or too low. If the heating is off or is on but the thermostat is set too low, the process at step 2218 sends a command to the thermostat on the network 200 associated with the space to turn on or to increase its temperature setting to provide heat to the space. The process 2200 then moves to step 2202 to receive new temperature data.

Referring to step 2206, if the measured temperature is less than the desired temperature, the process 2200 moves to step 2220. At step 2220, the process 2200 determines whether the measured temperature is too hot or greater than the desired temperature. If the measured temperature is within a selected percentage of the desired temperature, such that the measured temperature is neither too hot nor too cold, the process 2200 moves to step 2202 to receive new temperature data. In an embodiment, the selected percentage is approximately ±5%, preferably ±2%, and more preferably ±0.5%. In other embodiments, the selected percentage is approximately ±10%.

If the measured temperature is too hot greater than the desired temperature, the process 2200 moves to step 2222, where the process 2200 determines whether the heating is on. If the heating is on, the process 2200 at step 2224 sends a command to the thermostats on the network 200 associated with the space to turn off or to decrease the thermostat's temperature settings to decrease the heating in the space. The process 2200 then moves to step 2202 to receive new temperature data.

If the heating is off, the process 2200 at step 2226 determines whether the window coverings 152 are lowered. If the window coverings 152 are raised, the process 2200 at step 2228 send a command to the window covering controller 2000 to lower the window coverings 152 to decrease the sunlight heating the space. In an embodiment, the hub 250 sends the window covering command through the network 200 and the local controller 1800 to the window covering controller 2000. The process 2200 then moves to step 2202 to receive new temperature data.

If the window coverings are lowered, the process 2200 at step 2230 determines whether the slats 154 are closed. If the slats 154 are open, the process 2200 at step 2232 send a command to the window covering controller 2000 to close the slats 154 to decrease the sunlight heating the space. In an embodiment, the hub 250 sends the window covering command through the network 200 and the local controller 1800 to the window covering controller 2000. The process 2200 then moves to step 2202 to receive new temperature data.

If the slats 154 are closed at step 2230, the process 2200 sends an alert to a user indicating that no adjustments were made. The process 2200 then moves to step 2202 to receive new temperature data.

Individual Preferences

In an embodiment, the desired light intensity or the desired temperature may be determined by recommended or standard settings. For example, one commonly recommended light level for a work space is around 500 Lux. A commonly cited temperature setting for comfort and energy conservation is 75° F. While the desired light levels and temperature can depend on the time of day and the use of the space, they also can be based on individuals' preferences. In an embodiment, these preferences are stored at the hub 250. In another embodiment, the individuals' preferences are stored in the memory 2020 of the window covering controller 2000.

The preferences can comprise, for example, one or more of a preferred temperature, a preferred light intensity, a time of day that regardless of the temperature and light intensity the window coverings 152 are lowered for privacy and/or security, a time of day that regardless of the temperature and light intensity the window coverings 152 are raised to provide a view, and the like.

Thus, each individual can have a rule set comprising his preferences. In an embodiment, the sensors 2050 comprise sensors to detect the presence of a person or a specific individual, such as sensors 2050 that recognize an indication of a mobile phone associated with an individual, such as the RF envelope detector/antenna 2055, Bluetooth receiver/antenna 2055, Wi-Fi receiver/antenna 2055, cellular modem/antenna 2055, and geolocation service, as described above. The window covering control system identifies an individual's rule set based on the detected mobile device indication associated with the individual. In other embodiments described above, the sensor 2050 comprises image recognition device(s) and image recognition software to recognize the individual. The window covering control system identifies an individual's rule set based on the image of the individual.

In another embodiment, the window covering control system comprises a first set of desired conditions based on occupancy of the space and a second set of desired conditions based on the space being unoccupied. Other sensors 2050, as described above, such as motion sensors, proximity switches, and the like can detect the presence of an occupant.

Conflict Resolution

Figure 23:
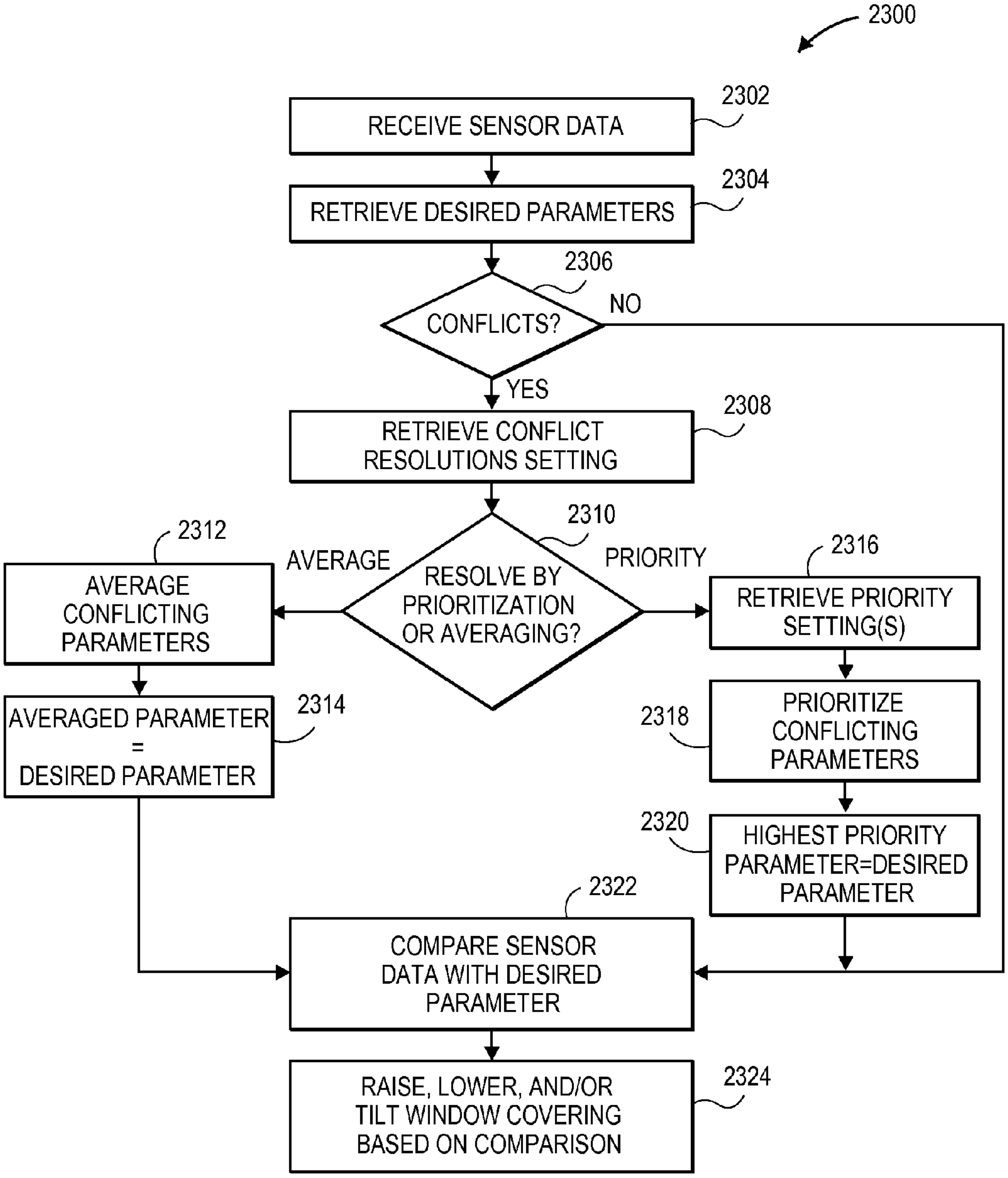
FIG. 23 illustrates a process to automatically resolve conflicts between desired window covering control parameters, according to certain embodiments.

FIG. 23 illustrates a process 2300 to automatically resolve conflicts between desired window covering control parameters. For example, the recommended desired setting may conflict with an individual's preferences. Further, if two or more individuals occupy the space associated with the window covering 152, one individual's preferences may conflict with another's preferences.

At step 2302, the process 2300 receives the sensor data. At step 2304, the process 2300 retrieves the desired parameters. These may be the recommended desired parameters and the preferences of each person in the space.

At step 2306, the process 2300 determines whether a conflict exists among one or more desired parameters that affect the control of the window coverings 152. If there are no conflicts, the process 2300 moves to step 2322.

If one or more conflicts exist, the process 2300 moves to step 2308. At step 2308, the process 2300 retrieves conflict resolution settings. In an embodiment, the conflict resolution settings comprise averaging and prioritization. At step 2310, the process 2300 determines which the conflict resolution settings t use to resolve the conflict.

If conflicts are to be resolved using prioritization, the process 2300 moves to step 2316. At step 2316, the process 2300 retrieves the priority settings and at step 2318, the process 2300 prioritizes the conflicting parameters. For example, the priority setting determines whether the recommended parameters or an individual's preferences have priority. Further, the priority settings may prioritize individuals to determine which individual's preferences have priority. At step 2320, the process 2300 sets the desired parameter to the parameter with the highest priority.

If conflicts are to be resolved using averaging, the process 2300 move to step 2312. At step 2312, the process 2300 averages the conflicting parameters. For example, if the recommended desired temperature is 74° F., a first user's preference is 70° F., and a second user's preference is 75° F., then the average is 73° F. At step 2314, the process 2300 sets the desired parameter to the averaged parameter.

At step 2322, the process 2300 compares the sensor data with the desired parameter, and at step 2324, the process 2300, utilizing processes 2100, 2200, or the like, adjusts the window blind covering 152 based on the comparison of the sensor data and the desired parameter.

Overall Communications Flow

Figure 24A:
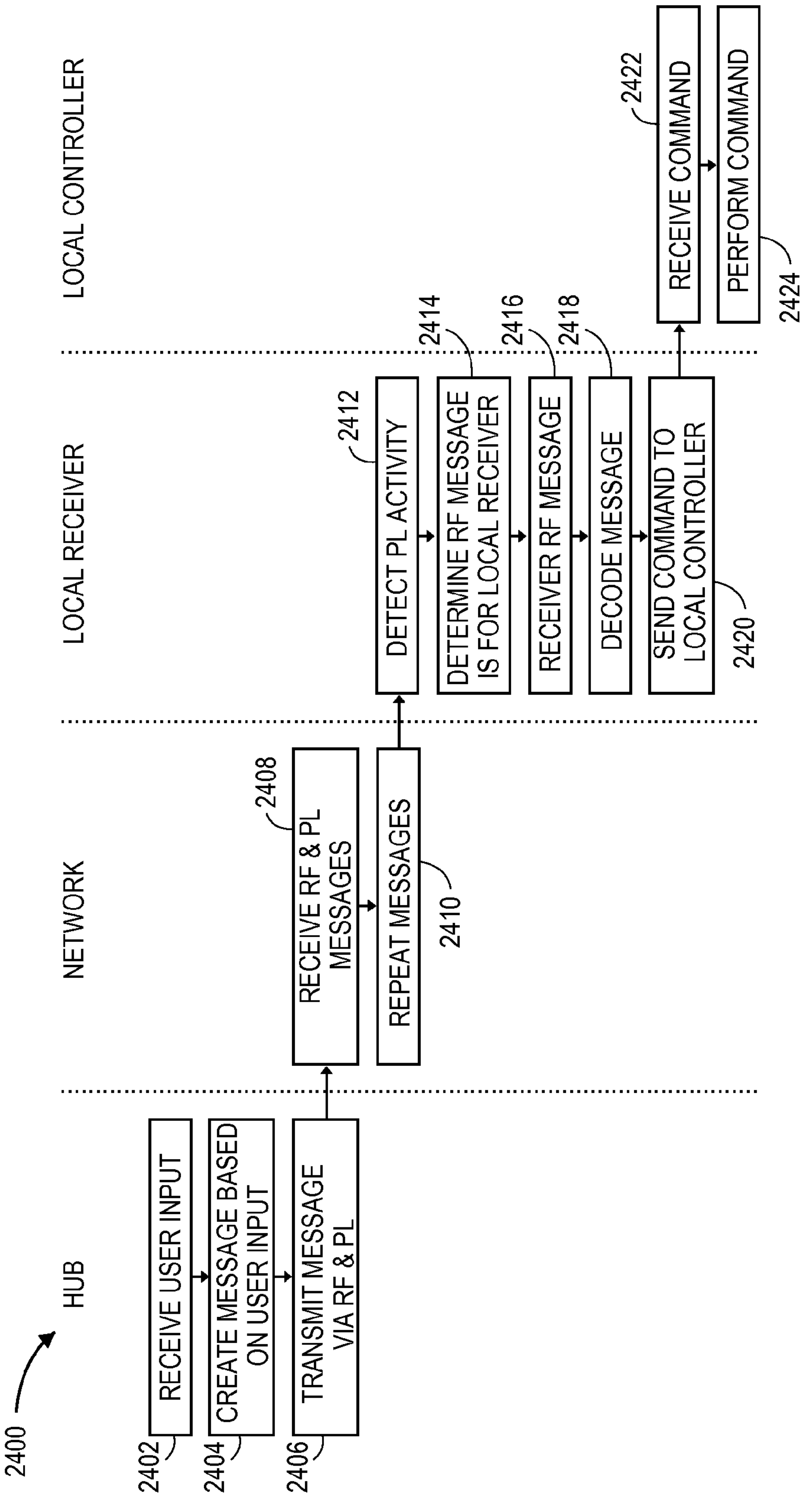
FIG. 24A illustrates the flow of communications from the hub to the local controller, according to certain embodiments.

FIG. 24A illustrates a flow of communications 2400 from the hub 250 to the local controller 2000. At step 2402, the hub 250 can receive input from a user. For example, the user can enter a command from the user computer 230 to perform an operation, such as, for example, to lock the door. At step 2404, the hub 250 creates at least one message addressed to the local receiver 1800 associated with the local controller 2000 based at least in part on the user's input. And at step 2406, the hub 250 transmits the message over the network 200 using one or more of powerline signaling and RF signaling as described above.

At step 2408, devices 220 on the network 200 receive the RF and/or powerline message, and at step 2410, the devices 220 propagate or repeat the message as described above.

At step 2412, the local receiver 1800 detects powerline activity on the network 200. In an embodiment, the antenna 1836 detects the electromagnetic field generated by the modulated carrier signal of the powerline messages and the powerline message detector 1855 sends an interrupt to the processor 1815. Once altered to the presence of messages on the powerline, the local receiver 1800 checks for RF messages addressed to it at step 2414.

Once the local receiver 1800 detects an RF messages with its address, it receives the message from the network 200 at step 2416. At step 2418, the local receiver 1800 decodes the message and at step 2420, the local receiver 1800 sends the command and/or data from the decoded message to the local controller 2000.

At step 2422, the local controller 2000 receives the command and/or data from the local receiver 1800 and at step 2424, the local controller 2000 performs the operation, such as locking the door or unlocking the door, as requested by the user.

Figure 24B:
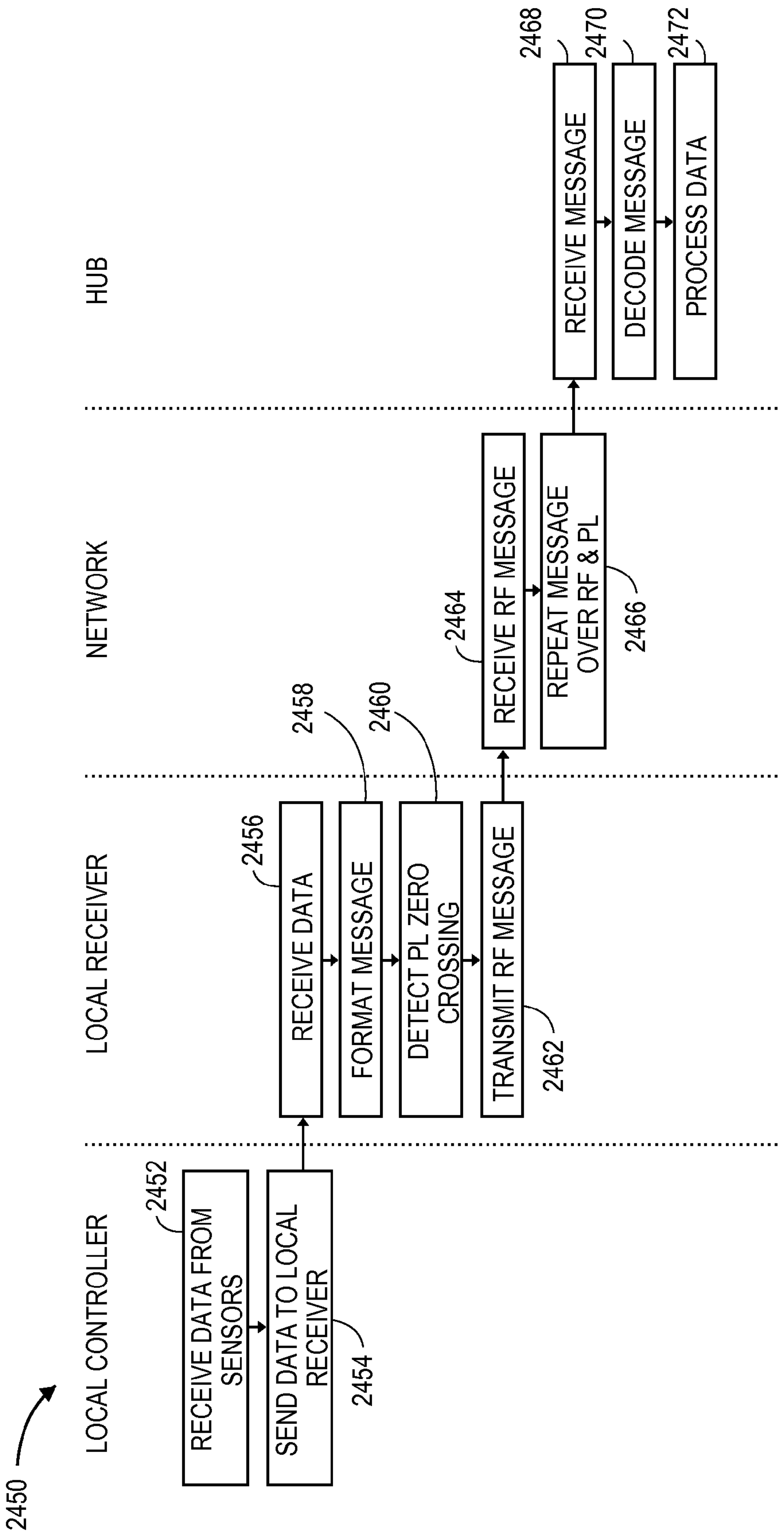
FIG. 24B illustrates the flow of communications from the local controller to the hub, according to certain embodiments.

FIG. 24B illustrates a flow of communications 2450 from the local controller 2000 to the hub 250. At step 2452, the local controller 2000 receives data from the sensors 2050. For example, the sensors 2050 detect the presence of an RF envelope from the user's cell phone. At step 2454, the local controller 2000 sends the data to the local receiver 1800.

At step 2456, the local receiver 1800 receives the data from the local controller 2000 and at step 2458, the local receiver 1800 formats a message comprising the data, as described above. At step 2460, the local receiver 1800 detects the zero crossing of the powerline in order to synchronize its RF transmission with the timing of the network 200. At step 2462, the local receiver 1800 transmits the message to the network 200 using RF signaling as described above.

At step 2464, devices 220 on the network 200 receive the RF message, and at step 2466, the devices 220 propagate or repeat the message over the network using powerline and RF signaling as described above.

At step 2468, the message propagates to the hub 250, where it is received. At step 2470, the hub 250 decodes the message and at step 2472, the hub 250 processes the data. For example, the hub 250 could determine whether the cell phone that was detected by the sensors 2050 is associated with an authorized user, and if so, could send a command to the local controller 2000 to unlock the door.

Terminology

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of certain embodiments is not intended to be exhaustive or to limit the invention to the precise form disclosed above. While specific embodiments of, and examples for, the invention are described above for illustrative purposes, various equivalent modifications are possible within the scope of the invention, as those ordinary skilled in the relevant art will recognize. For example, while processes, steps, or blocks are presented in a given order, alternative embodiments may perform routines having steps, or employ systems having blocks, in a different order, and some processes, steps, or blocks may be deleted, moved, added, subdivided, combined, and/or modified. Each of these processes, steps, or blocks may be implemented in a variety of different ways. Also, while processes, steps, or blocks are at times shown as being performed in series, these processes, steps, or blocks may instead be performed in parallel, or may be performed at different times.

The teachings of the invention provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A battery-powered window covering control system operating remotely from a powerline and configured to interface with a mesh network, the system comprising:

a window covering controller configured to receive a window covering command, the window covering controller in communication with a window covering associated with a window to automatically adjust the window covering to at least partially cover and uncover the window between a first position and a second position based at least in part on the window covering command, wherein the window covering controller is electrically disconnected from a powerline;

a local receiver comprising a first antenna and a second antenna, the local receiver configured to detect with the first antenna an electromagnetic field generated by a presence of a carrier signal that is added to a powerline waveform, the carrier signal comprising a first radio frequency (RF) signal having a first frequency, the presence of the carrier signal indicating that a first message is encoded onto the powerline, wherein the local receiver is electrically disconnected from the powerline; and the local receiver further configured to wake up from an inactive state upon detecting the electromagnetic field generated by the presence of the carrier signal on the powerline in order to receive with the second antenna a second message via a second RF signal having a second RF frequency different from the first RF frequency, the local receiver further configured to determine whether a device address of the second message is an assigned address, the local receiver returning to an inactive state when the device address of the second message is not the assigned address, the second message comprising the window covering command when the device address is the assigned address, the local receiver sending the window covering command to the window covering controller.

2. The system of claim 1 further comprising a mesh network configured to transmit and receive messages using one or more of powerline signaling and RF signaling, the powerline signaling comprising message data modulated onto the carrier signal and the modulated carrier signal added to the powerline waveform, the RF signaling comprising the message data modulated onto the second RF signal.

3. The system of claim 2 further comprising a hub device in communication with the mesh network and configured to receive sensor data and to generate the window covering command based at least in part on the sensor data.

4. The system of claim 3 wherein the sensor data comprises at least one of temperature data and light intensity data of a space associated with the window.

5. The system of claim 4 wherein the hub device is further configured to receive identifiers associated with one or more occupants and to retrieve preferences of the one or more occupants based at least in part on the identifiers.

6. The system of claim 5 wherein the hub device is further configured to generate the window covering command based at least in part on at least one of the temperature data, the light intensity data, and the preferences.

7. The system of claim 1 further comprising at least one sensor, wherein the window covering controller is further configured to receive sensor data from the at least one sensor.

8. The system of claim 7 wherein the local receiver is further configured to receive the sensor data from the window covering controller, to modulate the sensor data onto the second RF signal having the second frequency, and to transmit the modulated RF signal comprising the sensor data over the mesh network.

9. The system of claim 8 further comprising a hub device in communication with the mesh network and configured to receive the modulated RF signal comprising the sensor data from the mesh network, to recover the sensor data, and to generate the window covering command based at least in part of the sensor data.

10. The system of claim 1 further comprising a power supply comprising a battery configured to supply power, the power supply in communication with the window covering controller and the local receiver.

11. A method to control a window covering, the method comprising:

detecting with a first antenna an electromagnetic field generated by a presence of a carrier signal that is added to a powerline waveform, the carrier signal comprising a first radio frequency (RF) signal having a first frequency, the presence of the carrier signal indicating that a first message is encoded onto a powerline;

waking up a local receiver from an inactive state upon detecting the electromagnetic field generated by the presence of the carrier signal on the powerline in order to receive with the second antenna a second message via a second RF signal having a second RF frequency different from the first RF frequency, wherein the local receiver is electrically disconnected from the powerline;

determining whether a device address of the second message is an assigned address, the second message comprising a window covering command when the device address is the assigned address;

returning the local receiver to an inactive state when the device address of the second message is not the assigned address;

sending to a window covering controller the window covering command when the device address of the second message is the assigned address; and automatically moving a window covering configured to at least partially cover and uncover a window between a first position and a second position based at least in part on the window covering command, wherein the window covering controller is electrically disconnected from the powerline.

12. The method of claim 11 further comprising propagating the window covering command to control the window cover through a mesh network configured to use one or more of powerline signaling and radio frequency (RF) signaling, the powerline signaling comprising message data modulated onto the carrier signal and the modulated carrier signal added to the powerline waveform, the RF signaling comprising the message data modulated onto the second RF signal.

13. The method of claim 12 further comprising propagating sensor data through the mesh network and generating the window covering command based at least in part on the sensor data.

14. The method of claim 13 wherein the sensor data comprises at least one of temperature data and light intensity data of a space associated with the window.

15. The method of claim 14 further comprising receiving identifiers associated with one or more occupants and retrieving preferences of the one or more occupants based at least in part on the identifiers.

16. The method of claim 15 further comprising generating the window covering command based at least in part on at least one of the temperature data, the light intensity data, and the preferences.

17. The method of claim 11 further comprising receiving with the window covering controller sensor data from at least one sensor.

18. The method of claim 17 further comprising receiving with the local receiver the sensor data from the window covering controller, modulating the sensor data onto the second RF signal having the second frequency, and transmitting the modulated RF signal comprising the sensor data over the mesh network.

19. The method of claim 18 further comprising receiving the modulated RF signal comprising the sensor data from the mesh network, recovering the sensor data, and generating the window covering command based at least in part on the sensor data.

20. The method of claim 11 further comprising supplying operating power to the window covering controller and the local receiver from a battery-operated power supply and not supplying operating power from the powerline.

* * * * *